US010133178B2

(12) United States Patent
Nishita et al.

(10) Patent No.: US 10,133,178 B2
(45) Date of Patent: Nov. 20, 2018

(54) COATING LIQUID FOR RESIST PATTERN COATING

(71) Applicant: NISSAN CHEMICAL INDUSTRIES, LTD., Tokyo (JP)

(72) Inventors: Tokio Nishita, Toyama (JP); Shuhei Shigaki, Toyama (JP); Noriaki Fujitani, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/512,802

(22) PCT Filed: Sep. 18, 2015

(86) PCT No.: PCT/JP2015/076715
§ 371 (c)(1),
(2) Date: Mar. 20, 2017

(87) PCT Pub. No.: WO2016/043317
PCT Pub. Date: Mar. 24, 2016

(65) Prior Publication Data
US 2017/0293227 A1    Oct. 12, 2017

(30) Foreign Application Priority Data

Sep. 19, 2014  (JP) ................................ 2014-190849
Sep. 30, 2014  (JP) ................................ 2014-201382

(51) Int. Cl.
*G03F 7/40*      (2006.01)
*C08F 212/12*    (2006.01)
(Continued)

(52) U.S. Cl.
CPC .............. *G03F 7/40* (2013.01); *C08F 212/12* (2013.01); *C08G 8/04* (2013.01); *C08G 77/14* (2013.01);
(Continued)

(58) Field of Classification Search
CPC .......... G03F 7/038; G03F 7/039; G03F 7/094; G03F 7/11; G03F 7/2006; G03F 7/322;
(Continued)

(56) References Cited

U.S. PATENT DOCUMENTS

| 2009/0317740 | A1* | 12/2009 | Hiroi ..................... G03F 7/11 430/270.1 |
| 2011/0204528 | A1* | 8/2011 | Matsutani ............... G03F 7/40 257/787 |
| 2012/0122037 | A1* | 5/2012 | Bradford ............... G03F 7/405 430/325 |

FOREIGN PATENT DOCUMENTS

JP    2001-281886 A    10/2001
JP    2002-333717 A    11/2002
(Continued)

OTHER PUBLICATIONS

Machine translation of JP 2004-126161 (no date).*
(Continued)

*Primary Examiner* — Amanda C. Walke
(74) *Attorney, Agent, or Firm* — Oliff PLC

(57) ABSTRACT

There is provided a new coating liquid for resist pattern coating. A coating liquid for resist pattern coating comprising a component A that is a polymer including at least one hydroxy group or carboxy group; a component B that is a sulfonic acid of A-SO$_3$H (where A is a linear or branched alkyl group or fluorinated alkyl group having a carbon atom number of 1 to 16, an aromatic group having at least one of the alkyl group or the fluorinated alkyl group as a substituent, or a $C_{4-16}$ alicyclic group optionally having a substitu-
(Continued)

ent); and a component C that is an organic solvent capable of dissolving the polymer and including ether or ketone compound of $R^1$—O—$R^2$ and/or $R^1$—C(=O)—$R^2$ (where $R^1$ is a linear, branched, or cyclic alkyl group or fluorinated alkyl group having a carbon atom number of 3 to 16; and $R^2$ is a linear, branched, or cyclic alkyl group or fluorinated alkyl group having a carbon atom number of 1 to 16), a method of forming a resist pattern using the coating liquid, and a method for forming a reverse pattern using the coating liquid.

14 Claims, 1 Drawing Sheet

(51) Int. Cl.
| | | |
|---|---|---|
| C09D 5/00 | (2006.01) | |
| C09D 7/00 | (2018.01) | |
| C09D 183/04 | (2006.01) | |
| C09D 201/00 | (2006.01) | |
| C09D 7/20 | (2018.01) | |
| C08G 8/04 | (2006.01) | |
| C08G 77/14 | (2006.01) | |
| C09D 125/16 | (2006.01) | |
| G03F 7/039 | (2006.01) | |
| G03F 7/09 | (2006.01) | |
| G03F 7/11 | (2006.01) | |
| G03F 7/16 | (2006.01) | |
| G03F 7/20 | (2006.01) | |
| G03F 7/32 | (2006.01) | |
| G03F 7/38 | (2006.01) | |
| H01L 21/02 | (2006.01) | |
| H01L 21/027 | (2006.01) | |
| H01L 21/311 | (2006.01) | |
| H01L 21/033 | (2006.01) | |

(52) U.S. Cl.
CPC ............... *C09D 5/00* (2013.01); *C09D 7/00* (2013.01); *C09D 7/20* (2018.01); *C09D 125/16* (2013.01); *C09D 183/04* (2013.01); *C09D 201/00* (2013.01); *G03F 7/039* (2013.01); *G03F 7/094* (2013.01); *G03F 7/11* (2013.01); *G03F 7/162* (2013.01); *G03F 7/168* (2013.01); *G03F 7/2006* (2013.01); *G03F 7/322* (2013.01); *G03F 7/38* (2013.01); *H01L 21/0206* (2013.01); *H01L 21/0273* (2013.01); *H01L 21/02118* (2013.01); *H01L 21/0332* (2013.01); *H01L 21/31133* (2013.01)

(58) Field of Classification Search
CPC ......... G03F 7/38; G03F 7/40; H01L 21/0274; C09D 125/16; C08G 8/04
USPC ...................................................... 430/270.1
See application file for complete search history.

(56) References Cited

FOREIGN PATENT DOCUMENTS

| | | |
|---|---|---|
| JP | 2004-126161 A | 4/2004 |
| JP | 2008-285540 A | 11/2008 |
| JP | 2010-049247 A | 3/2010 |
| JP | 2011-197628 A | 10/2011 |
| JP | 2011-257499 A | 12/2011 |
| JP | 2013-145290 A | 7/2013 |
| JP | 2013-156629 A | 8/2013 |
| JP | 2014-142634 A | 8/2014 |
| JP | 2016-48373 A | 4/2016 |
| WO | 2016/147989 A1 | 9/2016 |

OTHER PUBLICATIONS

Machine translation of JP 2002-333717 (no date).*
Dec. 15, 2015 International Search Report issued in International Patent Application No. PCT/JP2015/076715.
Dec. 15, 2015 Written Opinion of the International Searching Authority issued in International Patent Application No. PCT/JP2015/076715.
Dec. 6, 2017 Written Opinion issued in Singaporean Patent Application No. 11201702233S.
Aug. 15, 2018 Office Action issued in Japanese Patent Application No. 2016-548967.

* cited by examiner

COATING LIQUID FOR RESIST PATTERN COATING

TECHNICAL FIELD

The present invention relates to a coating liquid for resist pattern coating that can reduce the width or the diameter of a resist pattern. The present invention also relates to a method of forming a resist pattern and a method of forming a reverse pattern using the coating liquid.

BACKGROUND ART

In the production of semiconductor devices, microfabrication by lithography using a resist composition is carried out. The microfabrication is a processing method for forming a thin film of a photoresist composition on a semiconductor substrate such as a silicon wafer, irradiating the formed thin film with active light such as ultraviolet rays through a mask pattern in which the pattern of the device is drawn, developing the pattern, and etching the substrate using the obtained photoresist pattern as a protective film, whereby microscopic unevenness corresponding to the pattern is formed onto the substrate surface. In recent years, semiconductor devices have been further integrated and the active light used is also shortened from an i-line (wavelength 365 nm) and a KrF excimer laser (wavelength 248 nm) to an ArF excimer laser (wavelength 193 nm).

At present, lithography using EUV (abbreviation of extreme ultraviolet, wavelength 13.5 nm) exposure, which is a finer microfabrication technology, has been studied. The lithography using EUV exposure, however, has not yet been put into practical use (mass production) due to, for example, the delay in the development of a high-power EUV light source.

On the other hand, a method of applying a material for forming a reduced size resist pattern on a resist pattern to form a finer (reduced-size) resist pattern, and a coating material used for this method (for example, refer to Patent Document 1 to Patent Document 4) are known. By employing this method, a further finer resist pattern can be produced by lithography employing exposure by an ArF excimer laser which has already been put into practice.

PRIOR ART DOCUMENTS

Patent Documents

Patent Document 1: Japanese Patent Application Publication No. 2001-281886 (JP 2001-281886 A)
Patent Document 2: Japanese Patent Application Publication No. 2010-49247 (JP 2010-49247 A)
Patent Document 3: Japanese Patent Application Publication No. 2011-257499 (JP 2011-257499 A)
Patent Document 4: Japanese Patent Application Publication No. 2013-145290 (JP 2013-145290 A)

SUMMARY OF THE INVENTION

Problem to be Solved by the Invention

An aqueous solution containing a water-soluble resin (material for reducing size of resist pattern) described in Patent Document 1 uses water having a high surface tension compared with an organic solvent as a solvent, and thus the aqueous solution has difficulty in application to the resist pattern. Therefore, a surfactant is required to be added to the aqueous solution or the aqueous solution is required to be used by mixing a water-soluble alcohol with water. The composition for forming a finer resist pattern described in Patent Document 2 is a solution without containing a polymer, and thus the ratio of formed finer pattern is likely to vary depending on the shape of the target resist pattern for which a finer pattern is formed. The agent for forming a finer pattern described in Patent Document 3 contains an acid generator component, and thus baking treatment after application of the agent for forming a finer pattern is carried out at a high temperature of 130° C. or a step of exposing after application of the agent for forming a finer pattern is required to be added. An object of the method for forming a fine pattern described in Patent Document 4 is to narrow down a resist pattern formed by a negative type development process, that is, to form a smaller space width being an interval between the resist patterns by heating after a coated film is formed on the resist pattern. Therefore, the method for forming a fine pattern described in Patent Document 4 does not aim to reduce the width or the radius of the resist pattern.

The present invention has been made to solve the above problems, and an object of the present invention is to provide a coating liquid for resist pattern coating that can reduce the width of a resist pattern, a method of forming a resist pattern using the coating liquid, and a method for forming a reverse pattern using the coating liquid.

Means for Solving the Problem

A first aspect of the present invention is a coating liquid for resist pattern coating comprising:
a component A: a polymer including at least one hydroxy group or carboxy group; a component B: a sulfonic acid of A-SO$_3$H (where A is a linear or branched alkyl group or fluorinated alkyl group having a carbon atom number of 1 to 16, an aromatic group having at least one of the alkyl group or the fluorinated alkyl group as a substituent, or a C$_{4-16}$ alicyclic group optionally having a substituent); and a component C: an organic solvent capable of dissolving the polymer and including a compound of R$^1$—O—R$^2$ and/or R$^1$—C(=O)—R$^2$ (where R$^1$ is a linear, branched, or cyclic alkyl group or fluorinated alkyl group having a carbon atom number of 3 to 16; and R$^2$ is a linear, branched, or cyclic alkyl group or fluorinated alkyl group having a carbon atom number of 1 to 16).

The polymer being the component A may further include a linear, branched, or cyclic alkyl group having a carbon atom number of 1 to 10 in which a halogen atom is optionally substituted for at least one hydrogen atom.

The polymer being the component A included in the coating liquid for resist pattern coating of the present invention may be a polymer having a structure unit of Formula (A).

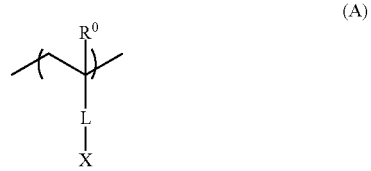

(A)

(where R$^0$ is a hydrogen atom or methyl group;
L is a divalent aromatic group optionally having at least one substituent, —C(=O)—O— group or —C(=O)—

NH— group, and a carbon atom of the —C(=O)—O— group or the —C(=O)—NH— group is bonded to the main chain of the polymer;

X is a hydrogen atom or a linear or branched alkyl group having a carbon atom number of 1 to 10 or an alkoxy group having a carbon atom number of 1 to 10, and a halogen atom or hydroxy group is optionally substituted for at least one hydrogen atom of the alkyl group);

with the proviso that the polymer having the structure unit of Formula (A) includes at least one hydroxy group or carboxy group and optionally includes a linear, branched, or cyclic alkyl group having a carbon atom number of 1 to 10 in which a halogen atom is optionally substituted for at least one hydrogen atom.

The polymer being the component A is preferably a copolymer having at least two structure units of Formula (A), for example, can be a copolymer having a structural unit of a divalent aromatic group optionally having at least one substituent as L and a structure unit of —C(=O)—O— group and/or a structure unit of —C(=O)—NH— group as L.

In Formula (A), the divalent aromatic group in L may be phenylene group or naphthylene group.

The polymer being the component A included in the coating liquid for resist pattern coating of the present invention may also be a polymer having a structure unit of any one of Formulas (1-1) to (1-4).

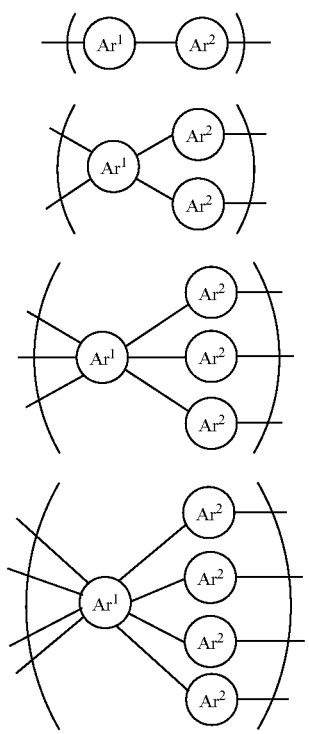

(where $Ar^1$ is a divalent, tetravalent, hexavalent, or octavalent organic group including at least one $C_{6-18}$ aromatic ring; $Ar^2$ is a divalent organic group including a $C_{6-18}$ aromatic ring bonded to $Ar^1$ through methylene group or a tertiary carbon atom, and at least one of the aromatic rings have hydroxy group and/or carboxy group as a substituent)

The polymer having a structure unit of any one of Formulas (1-1) to (1-4) optionally further includes a linear or branched alkyl group having a carbon atom number of 1 to 10 in which a halogen atom is optionally substituted for at least one hydrogen atom.

The divalent, tetravalent, hexavalent, or octavalent organic group of $Ar^1$ is, for example, a group having bonded ends bonded to any two, four, six, or eight positions of aromatic rings in a compound of any one of Formulas (2-1) to (2-5); the bonded ends and the divalent organic group of $Ar^2$ are bonded; and $Ar^2$ is a divalent organic group of Formula (3-1), or a divalent organic group of Formula (3-2).

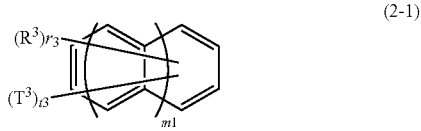

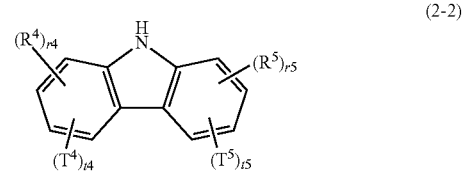

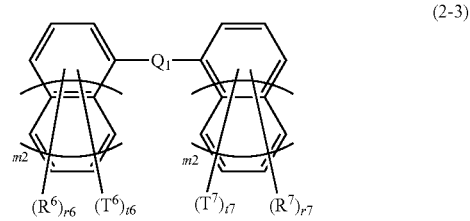

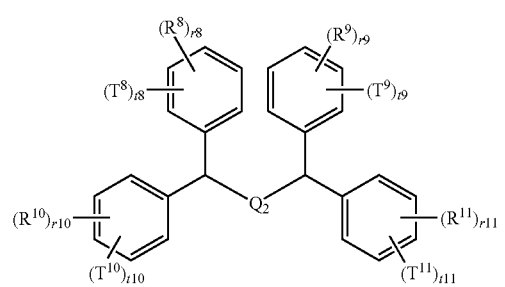

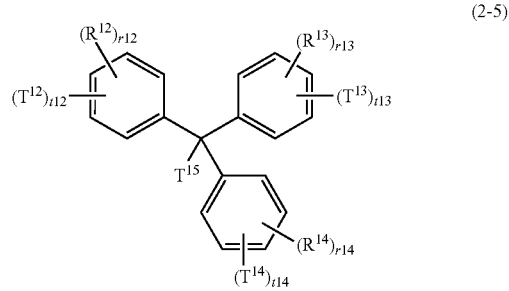

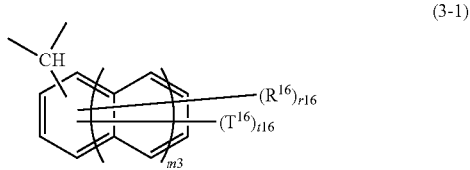

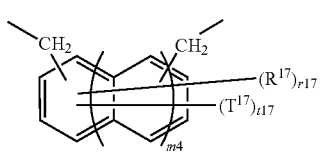

(3-2)

[where $R^3$ to $R^{14}$, $R^{16}$, and $R^{17}$ are each independently a linear, branched, or cyclic alkyl group having a carbon atom number of 1 to 10, a linear or branched alkoxy group having a carbon atom number of 1 to 9, a halogen atom, nitro group, cyano group, acetoxy group, methylthio group, or amino group; hydroxy group or a halogen atom is optionally substituted for at least one hydrogen atom of the alkyl group; a linear or branched alkyl group having a carbon atom number of 1 to 3 is optionally substituted for at least one hydrogen atom of the amino group; $T^3$ to $T^{14}$, $T^{16}$, and $T^{17}$ are each independently hydroxy group or carboxy group; $T^{15}$ is a hydrogen atom or methyl group; $Q_1$ and $Q_2$ are each independently a single bond, an oxygen atom, a sulfur atom, sulfonyl group, carbonyl group, imino group, a $C_{6-40}$ arylene group, or a linear, branched, or cyclic alkylene group having a carbon atom number of 1 to 10; a halogen atom is optionally substituted for at least one hydrogen atom of the alkylene group; m1 to m4 are each independently an integer of 0 to 2; r4, r5, and r8 to r14 are each independently an integer of 0 to 2; t4, t5, and t8 to t14 are each independently an integer of 0 to 2; r3, r6, r7, and r17 are each independently an integer of 0 to 8; t3, t6, t7, and t17 are each independently an integer of 0 to 8; r16 is an integer of 0 to 9; t16 is an integer of 0 to 9; and the sum of r3 and t3, the sum of r4 and t4, the sum of r5 and t5, the sum of r6 and t6, the sum of r7 and t7, the sum of r8 and t8, the sum of r9 and t9, the sum of r10 and t10, the sum of r11 and t11, the sum of r12 and t12, the sum of r13 and t13, the sum of r14 and t14, the sum of r16 and t16, and the sum of r17 and t17 are each independently an integer of 1 to 10].

The weight average molecular weight of the polymer being the component A included in the coating liquid for resist pattern coating of the present invention is 1,000 or more in terms of standard polystyrene.

When the polymer being the component A is a polymer having a structure unit of Formula (A), the weight average molecular weight of the polymer is, for example, from 1,000 to 2,000.

When the polymer being the component A is a polymer having a structure unit of any one of Formulas (1-1) to (1-4), the weight average molecular weight of the polymer is, for example, 1,000 to 20,000 or 1,000 to 4,000.

The aromatic group of A in the formula in the sulfonic acid being the component B included in the coating liquid for resist pattern coating of the present invention is, for example, phenyl group or naphthyl group and preferably phenyl group.

In the formula of the sulfonic acid, the group of A is preferably a linear or branched alkyl group or fluorinated alkyl group having a carbon atom number of 4 to 12, or phenyl group having at least one of the alkyl group or the fluorinated alkyl group as a substituent, and the content ratio of the sulfonic acid is preferably 0.5% by mass to 60% by mass relative to the polymer being the component A.

The coating liquid for resist pattern coating of the present invention optionally includes 1 ppm by mass to 1% by mass and preferably 1 ppm by mass to 0.5% by mass of water. When the coating liquid for resist pattern coating of the present invention includes more than 1% by mass of water, a homogeneous solution is difficult to prepare because the organic solvent in the coating liquid is difficult to be dissolved in water. On the other hand, the lower limit of the concentration of water included in the coating liquid for resist pattern coating of the present invention is a measurement limit value of an apparatus generally used for measuring water concentration, for example, a Karl Fischer moisture meter. The water included in the coating liquid for resist pattern coating of the present invention may be intentionally added or may be unintentionally included as an impurity.

A second aspect of the present invention is a method for forming a resist pattern comprising the steps of: forming a resist pattern on a substrate on which an underlayer film is formed; applying the coating liquid for resist pattern coating of the present invention so that the resist pattern is coated with the coating liquid for resist pattern coating; heating the substrate onto which the coating liquid for resist pattern coating is applied at 50° C. to 130° C. to form a coated film on a surface of the resist pattern; cooling the heated substrate and thereafter developing the coated film with a developing liquid; and rinsing the resist pattern with a rinsing liquid after developing the coated film with the developing liquid. In the present invention, the step of rinsing means a step in which the residual developing liquid on the substrate is replaced with the rinsing liquid to remove the developing liquid.

A third aspect of the present invention is a method for forming a reverse pattern comprising the steps of: forming a resist pattern on a substrate on which an underlayer film is formed; applying the coating liquid for resist pattern coating of the present invention so that the resist pattern is coated with the coating liquid for resist pattern coating; heating the substrate onto which the coating liquid for resist pattern coating is applied at 50° C. to 130° C. to form a coated film on a surface of the resist pattern; cooling the heated substrate and thereafter developing the coated film with a developing liquid; applying a second coating liquid including polysiloxane and a solvent including water and/or alcohols so that a space between patterns of the resist pattern after developing the coated film with the developing liquid is filled with the second coating liquid; removing or reducing components except polysiloxane included in the second coating liquid and the developing liquid to form a coated film; carrying out etch-back of the coated film to expose the upper surface of the resist pattern after developing with the developing liquid; and removing the resist pattern the upper surface of which is exposed.

In the method for forming a reverse pattern of the present invention, a step of rinsing with a rinsing liquid may be added after the step of developing with the developing liquid. More specifically, the method is a method for forming a reverse pattern comprising the steps of: forming a resist pattern on a substrate on which an underlayer film is formed; applying the coating liquid for resist pattern coating of the present invention so that the resist pattern is coated with the coating liquid for resist pattern coating; heating the substrate onto which the coating liquid for resist pattern coating is applied at 50° C. to 130° C. to form a coated film on a surface of the resist pattern; cooling the heated substrate and thereafter developing the coated film with a developing liquid; rinsing the resist pattern with a rinsing liquid after developing the coated film with the developing liquid; applying a second coating liquid including polysiloxane and a solvent including water and/or alcohols so that a space between patterns of the resist pattern after rinsing with the rinsing liquid is filled with the second coating liquid; removing or reducing components except polysiloxane included in the second coating liquid and the rinsing liquid to form a coated film; carrying out etch-back of the coated film to expose the upper surface of the resist pattern after rinsing with the rinsing liquid; and removing the resist pattern the upper surface of which is exposed.

In the method of forming the reverse pattern, when the step of rinsing with the rinsing liquid is included, the step of applying the second coating liquid is carried out in a state where the rinsing liquid remains on the substrate (without removing the rinsing liquid). On the other hand, when the step of rinsing is not included, a step of applying the second coating liquid is carried out in a state where the developing liquid remains on the substrate (without removing the developing liquid).

Effects of the Invention

The coating liquid for resist pattern coating of the present invention can be uniformly applied into a line-shaped and/or pillar-shaped resist pattern formed on a substrate without requiring a surfactant. Use the coating liquid for resist pattern coating of the present invention can uniformly reduce the width of the line pattern, even in a line and space pattern in which the ratio of the width of the line pattern and the width of the space pattern is different. The coating liquid for resist pattern coating of the present invention can change the reduction ratio of the width or the diameter of the resist pattern by selecting the included polymer. When EUV exposure will be put into practical use in the future, a further finer resist pattern prepared by using EUV exposure can be formed.

MODES FOR CARRYING OUT THE INVENTION

<Component A: Polymer>

Figure 1:
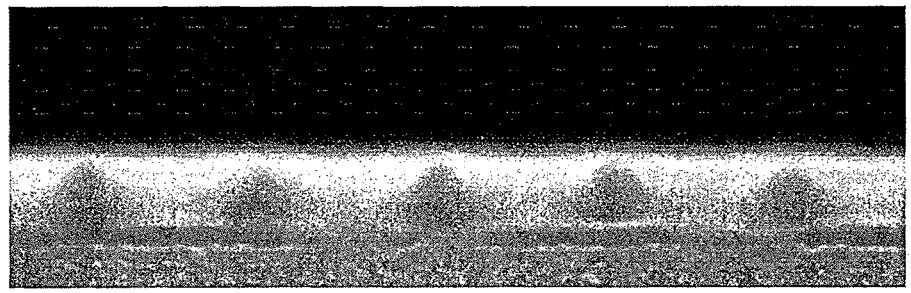
FIG. 1 is a cross-sectional SEM image illustrating a cross-sectional shape when a reduced size resist pattern on a silicon wafer is embedded with a second coating liquid in Example 6.

The polymer included in the coating liquid for resist pattern coating of the present invention is a polymer including at least one hydroxy group or carboxy group. When the polymer includes hydroxy group or carboxy group, solubility of the coated film formed on the surface of the resist pattern into the developing liquid is achieved. The polymer may further include a linear, branched, or cyclic alkyl group having a carbon atom number of 1 to 10 in which a halogen atom is substituted for at least one hydrogen atom. Among the alkyl groups, for example, tert-butyl group and trifluoromethyl group are preferable from the viewpoint of the solubility of the polymer into the organic solvent being the component C described below.

[Polymer Having Structure Unit of Formula (A) (Polymer 1)]

As the polymer of the component A, a polymer having the structure unit of Formula (A) (hereinafter referred to as Polymer 1) can be suitably used (with the proviso that the polymer having the structure unit of Formula (A) includes at least one hydroxy group or carboxy group and may further include a linear or branched alkyl group having a carbon atom number of 1 to 10 in which a halogen atom is optionally substituted for at least one hydrogen atom).

Polymer 1 may be a polymer including one structure unit of Formula (A) alone or a polymer including two or more structure units (that is, a copolymer).

In Formula (A), when X is a linear or branched alkyl group having a carbon atom number of 1 to 10, examples of the alkyl group include methyl group, ethyl group, n-propyl group, isopropyl group, n-butyl group, sec-butyl group, tert-butyl group, hexyl group, octyl group, and decyl group. Examples of the halogen atom substituted for at least one hydrogen atom of the alkyl group include fluorine, chlorine, bromine, and iodine. When X is a linear or branched alkoxy group having a carbon atom number of 1 to 10, examples of the alkoxy group include methoxy group, ethoxy group, n-propoxy group, isopropoxy group, n-butoxy group, sec-butoxy group, tert-butoxy group, hexyloxy group, octyloxy group, and decyloxy group.

When Polymer 1 is a copolymer, at least two structure units of Formula (A) may form any structure of a random copolymer, a block copolymer, or an alternating copolymer. Examples of such a copolymer include a copolymer having two or more structure units of Formulas (a-1) to (a-122).

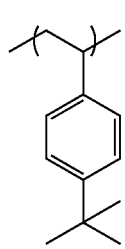 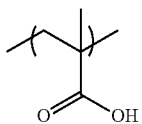 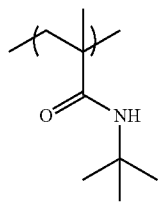
(a-5)
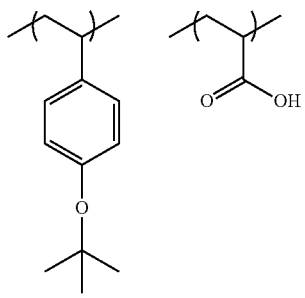
(a-10)
(a-6)
(a-11)
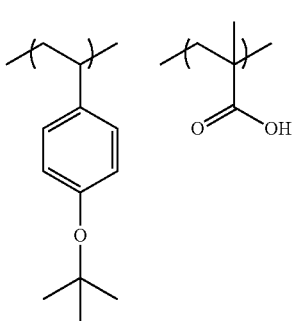
(a-7)
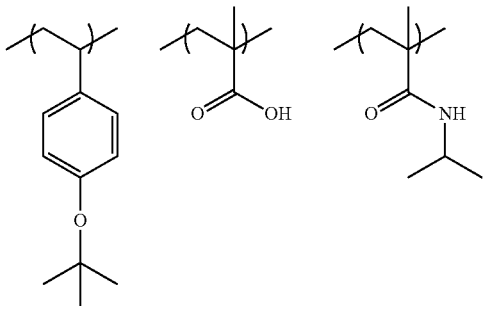
(a-12)
(a-8)
(a-13)
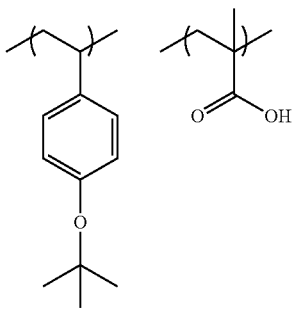
(a-9)
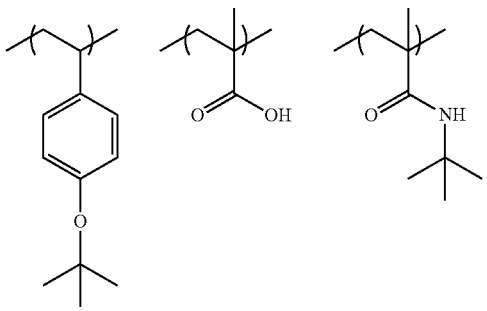
(a-14)
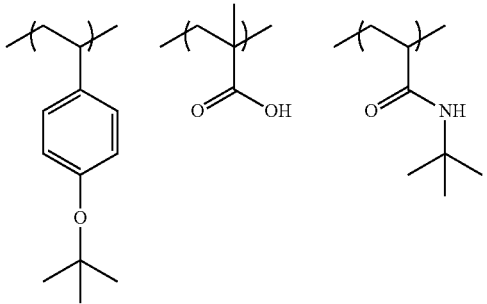

(a-15)
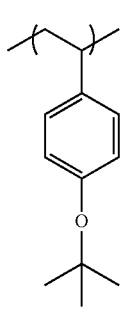 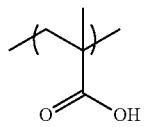 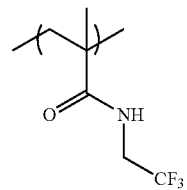
(a-16)
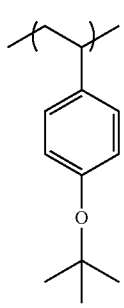 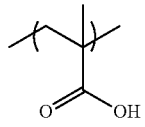 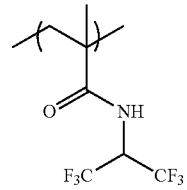
(a-17)
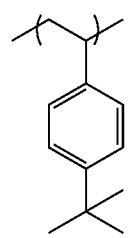 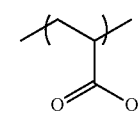 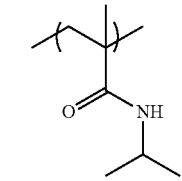
(a-18)
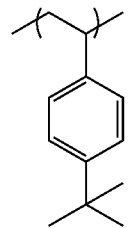 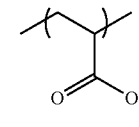 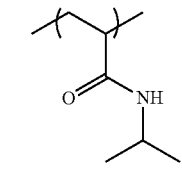
(a-19)
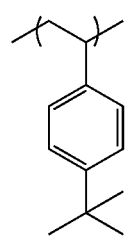 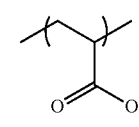 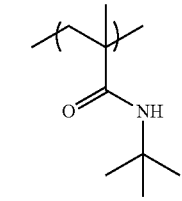
(a-20)
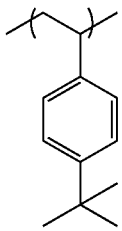 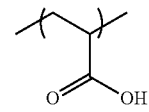 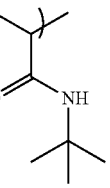
(a-21)
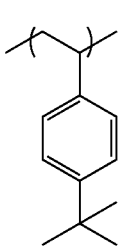 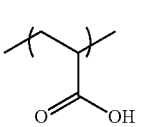 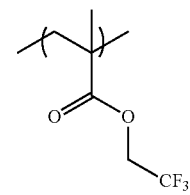
(a-22)
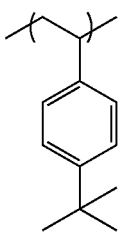 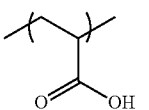 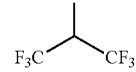
(a-23)
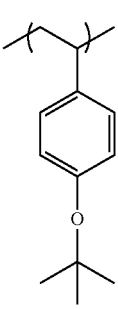 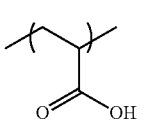 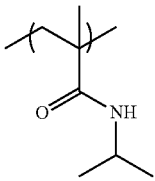
(a-24)
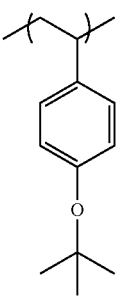 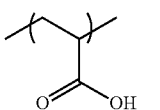 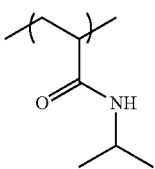

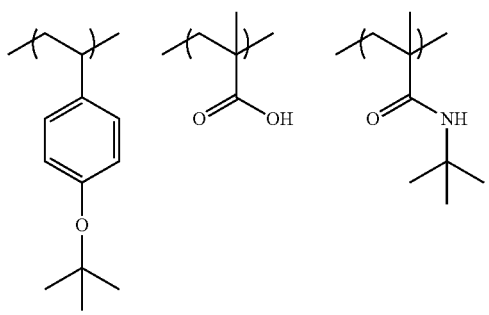# (a-25)
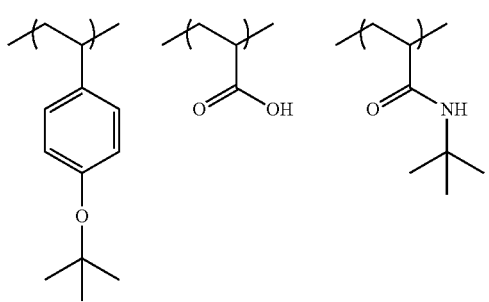# (a-26)
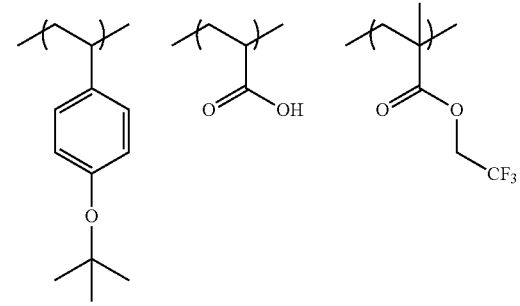# (a-27)
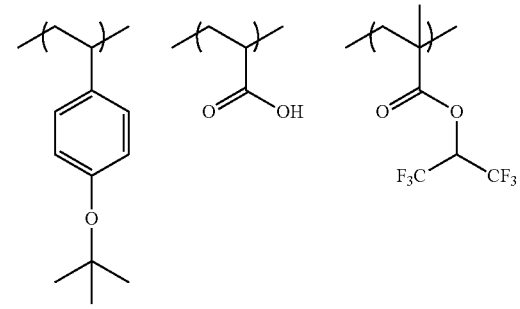# (a-28)
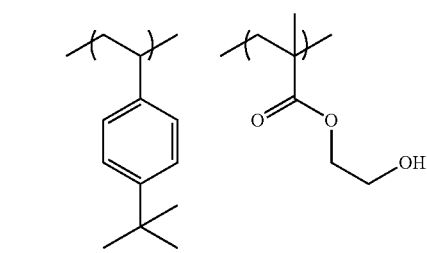# (a-29)
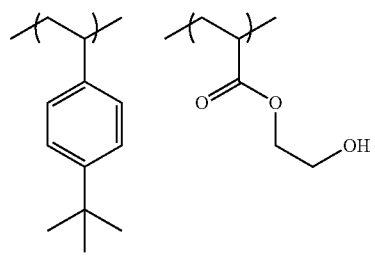# (a-30)
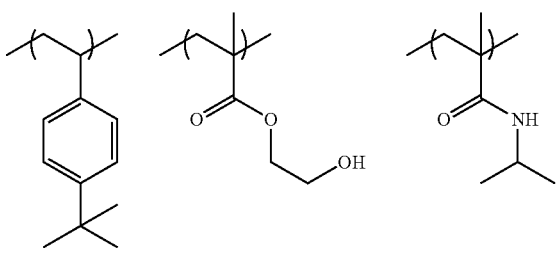# (a-31)
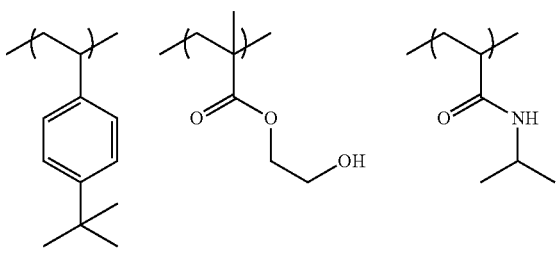# (a-32)
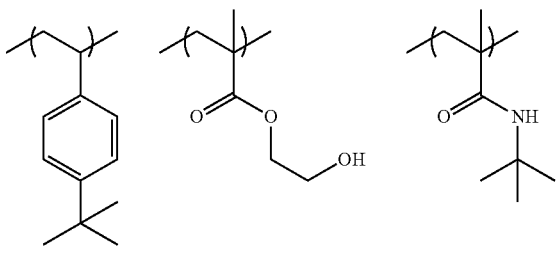# (a-33)
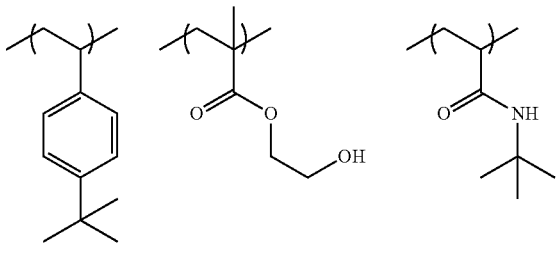# (a-34)
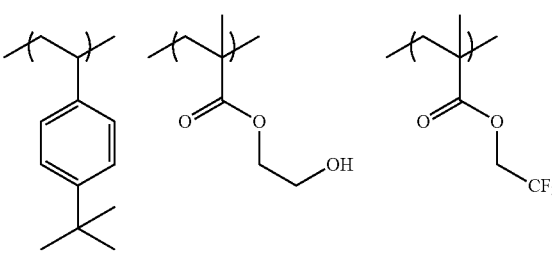# (a-35)

(a-36)
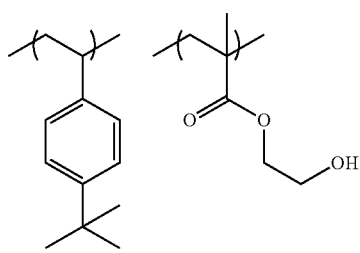 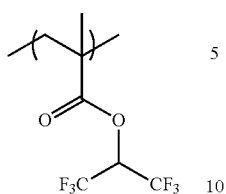
(a-37)
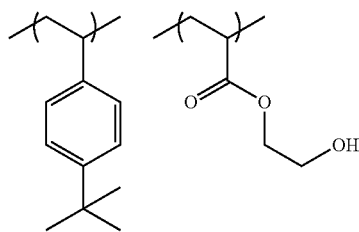 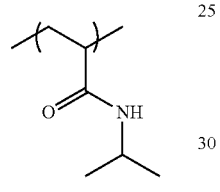
(a-38)
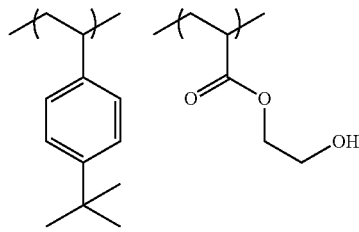 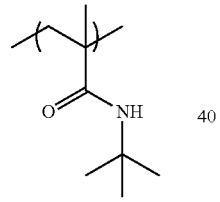
(a-39)
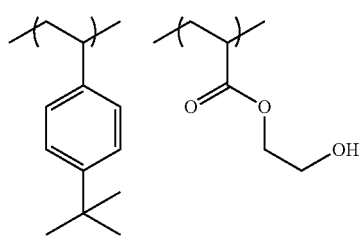 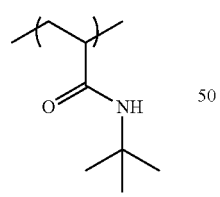
(a-40)
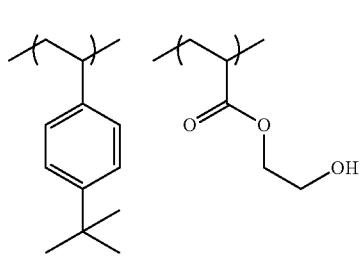 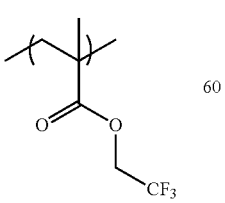
(a-41)
(a-42)
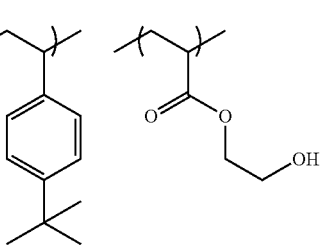 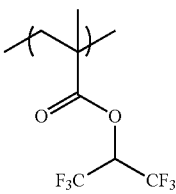
(a-43)
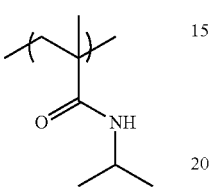
(a-44)
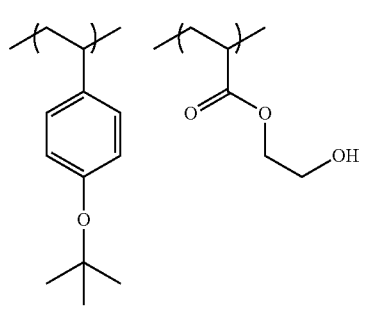
(a-45)
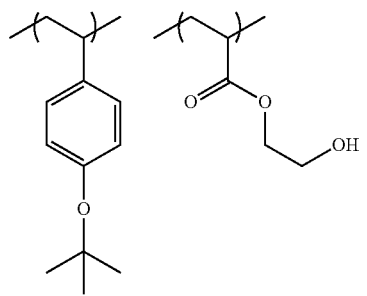
(a-46)
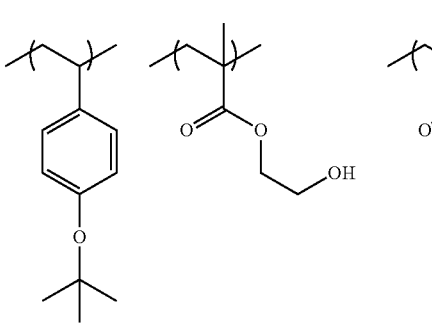
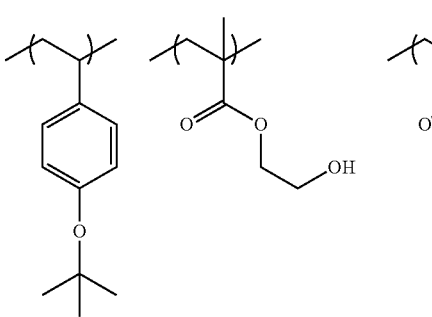

(a-47)
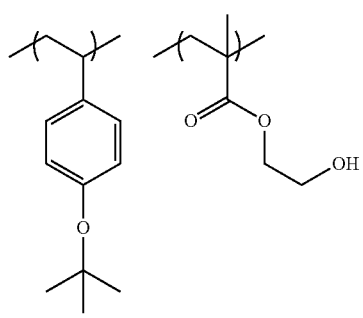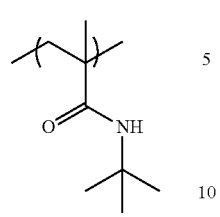
(a-48)
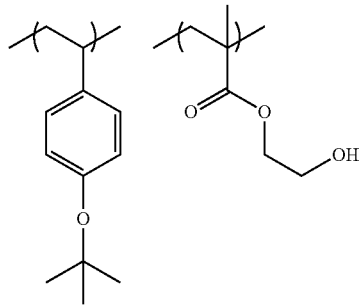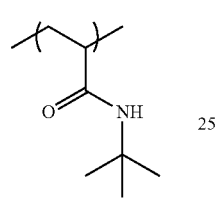
(a-49)
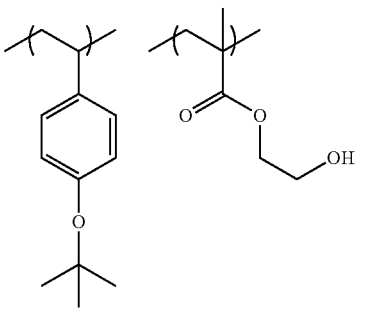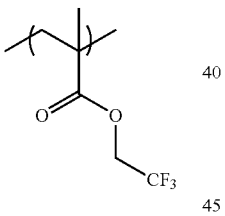
(a-50)
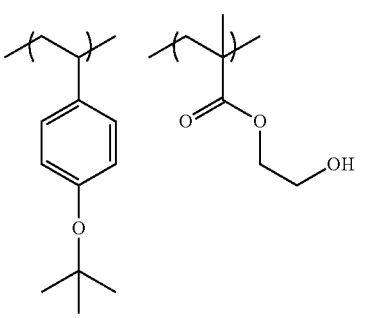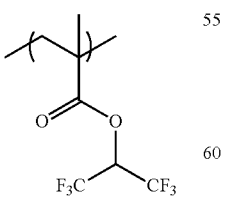
(a-51)
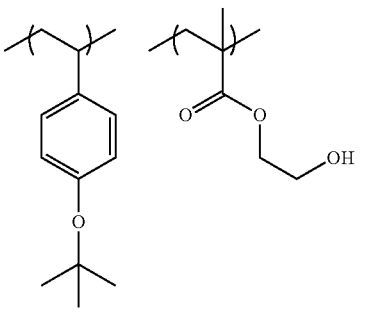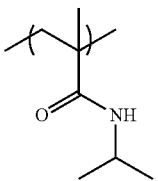
(a-52)
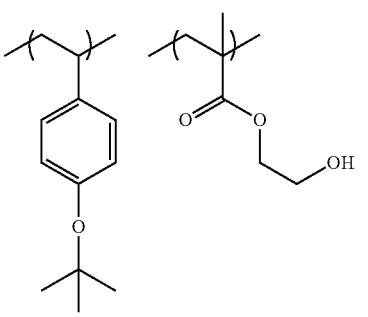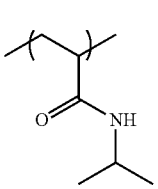
(a-53)
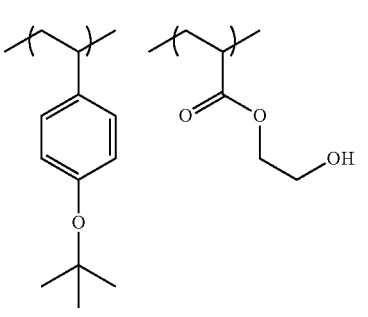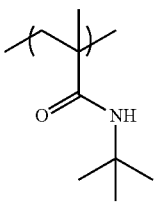
(a-54)
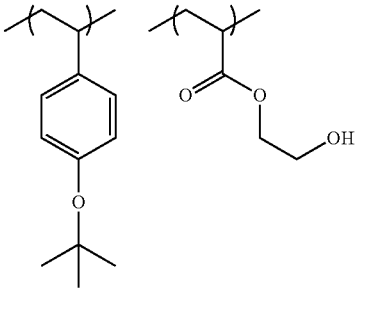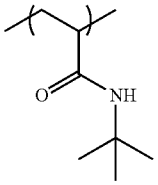
(a-55)
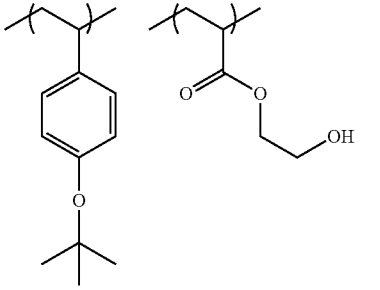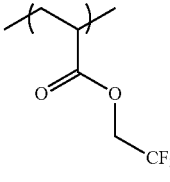

(a-56)
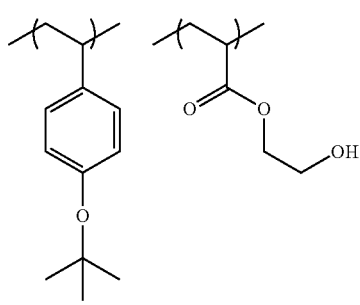
(a-57)
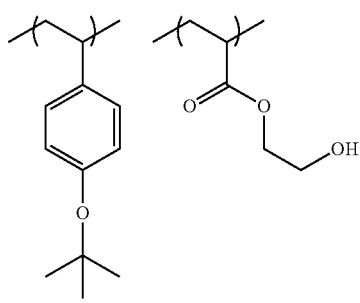
(a-58)
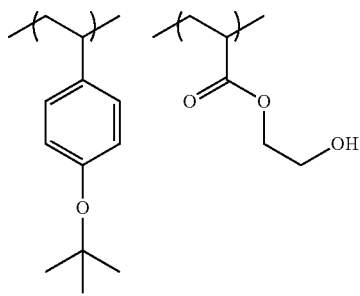
(a-59)
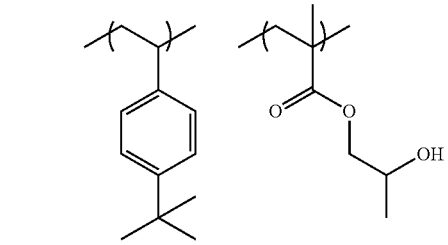
(a-60)
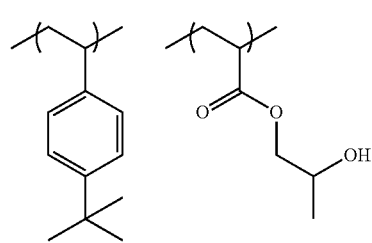
(a-61)
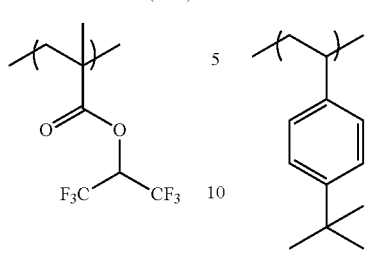
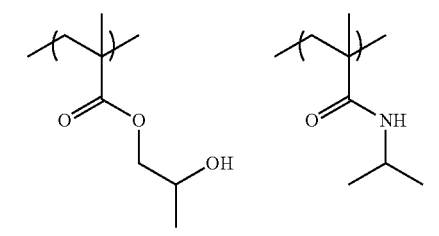
(a-62)
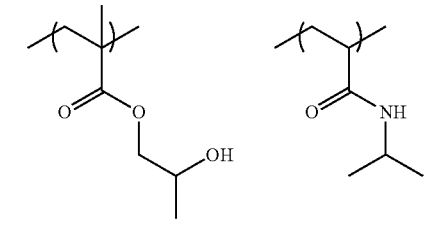
(a-63)
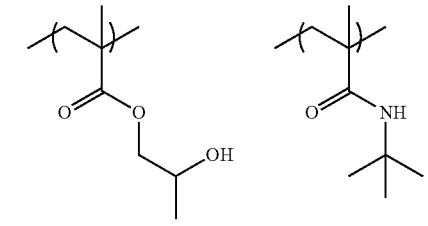
(a-64)
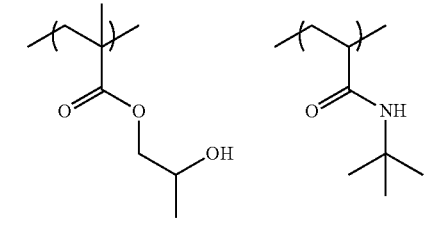
(a-65)
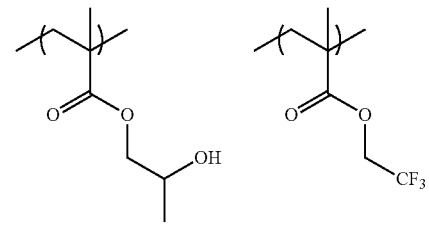
(a-66)
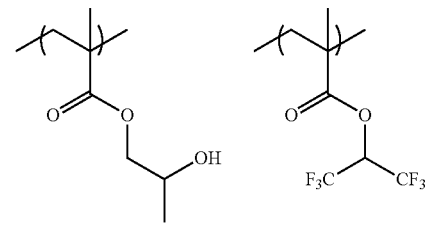

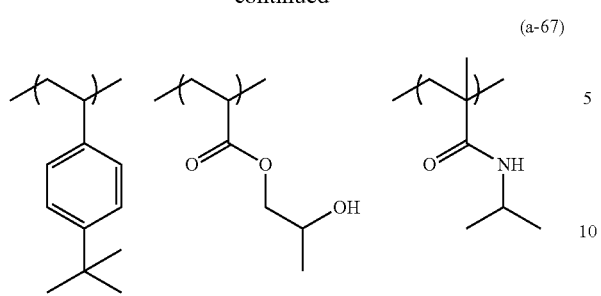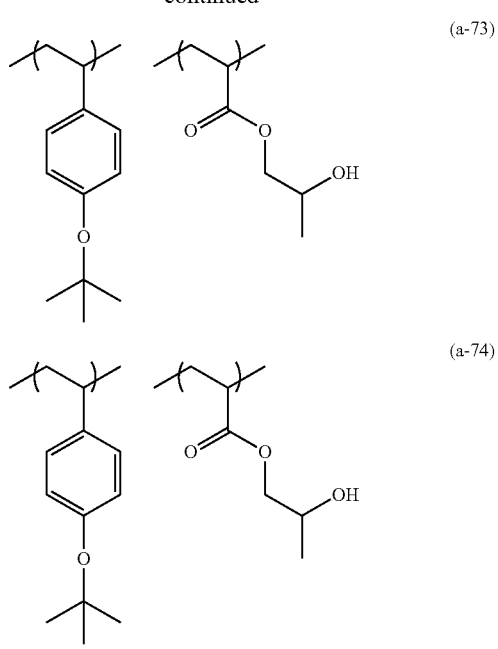

(a-78)
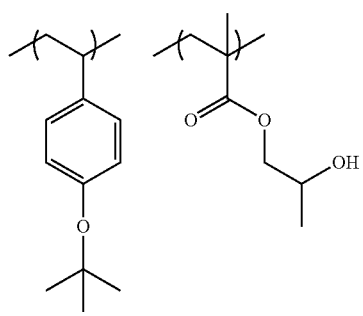
(a-83)
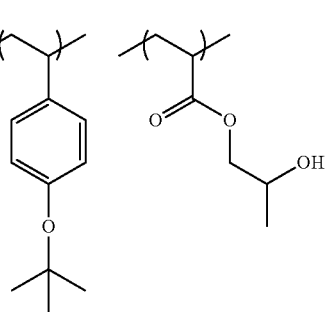
(a-79)
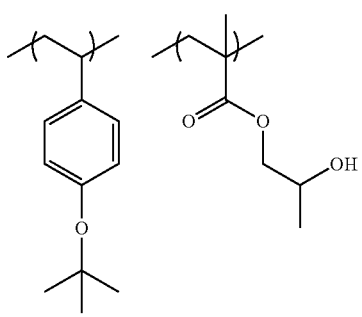
(a-84)
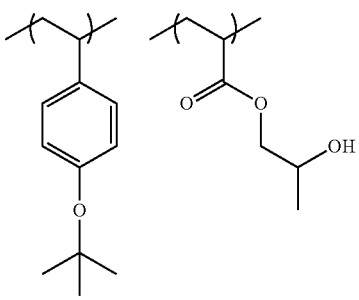
(a-80)
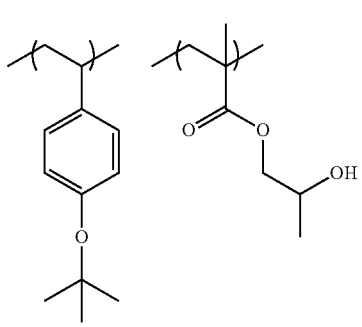
(a-85)
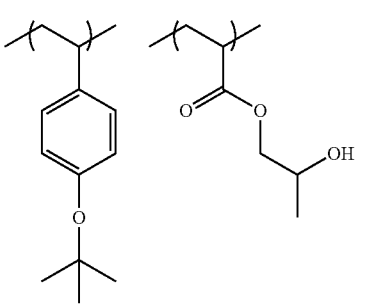
(a-81)
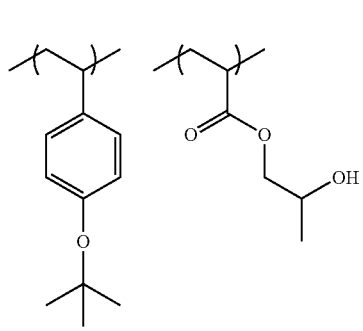
(a-86)
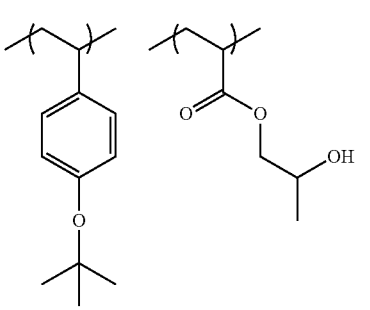
(a-82)
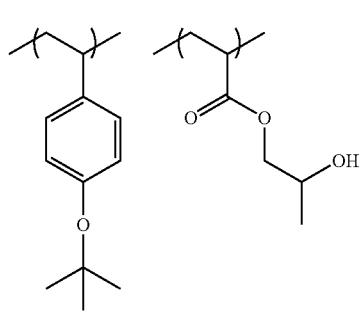
(a-87)
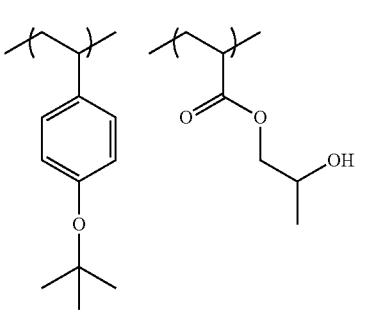

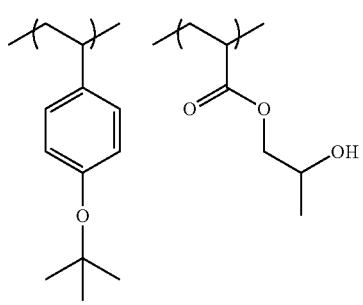 (a-88)
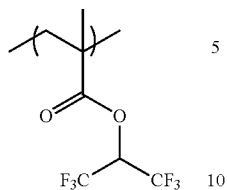 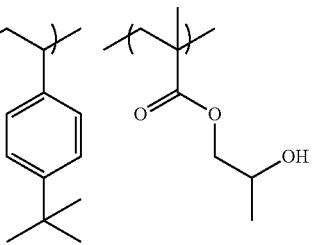 (a-93)
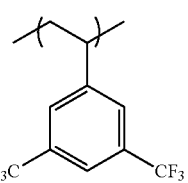
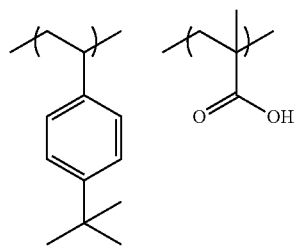 (a-89)
(a-94)
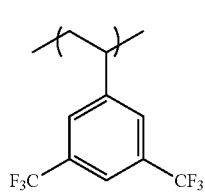 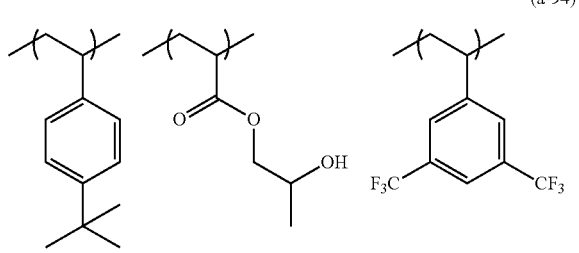
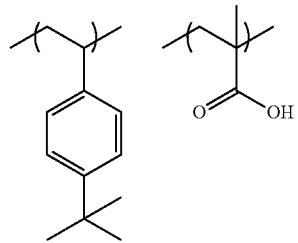 (a-90)
(a-95)
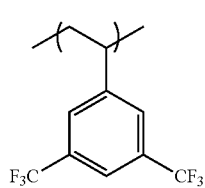 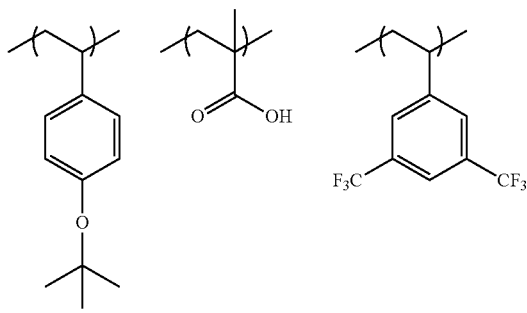
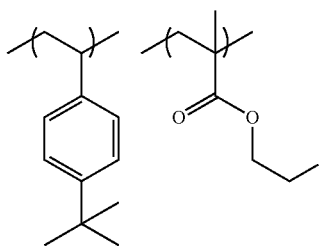 (a-91)
(a-96)
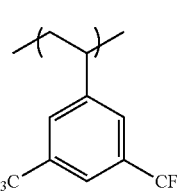 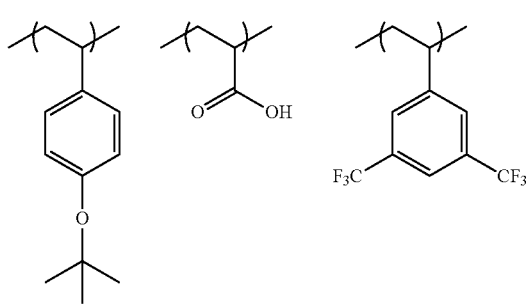
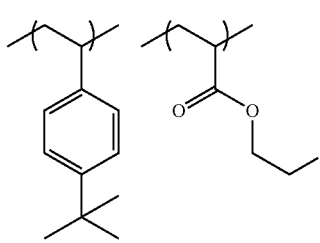 (a-92)
(a-97)
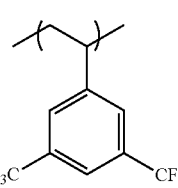 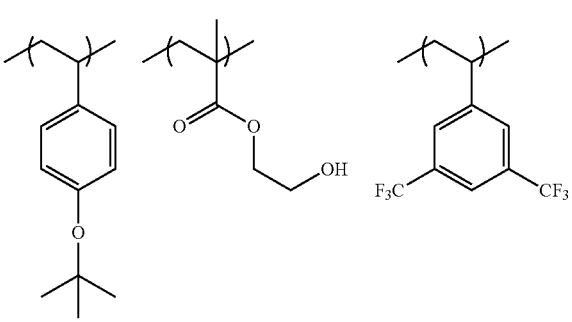

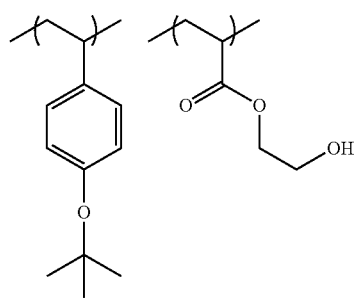
(a-98)
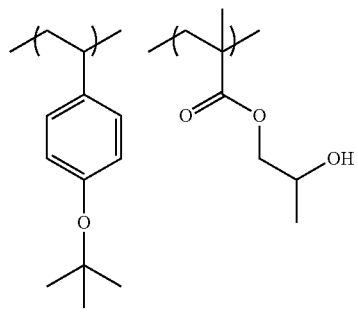
(a-99)
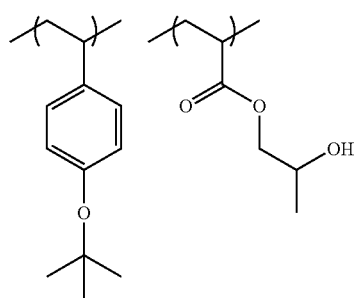
(a-100)
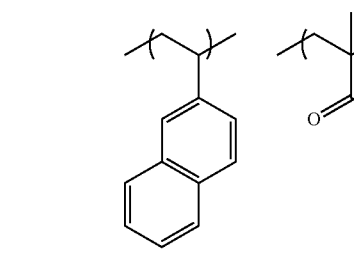
(a-101)
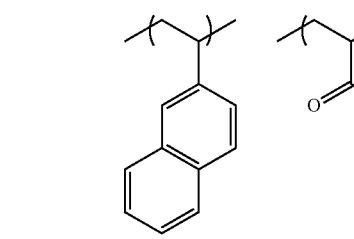
(a-102)
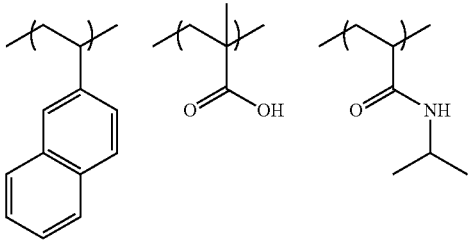
(a-103)
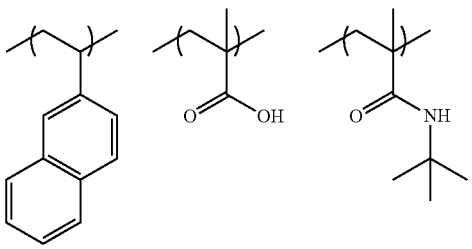
(a-104)
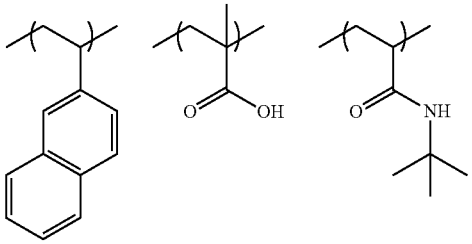
(a-105)
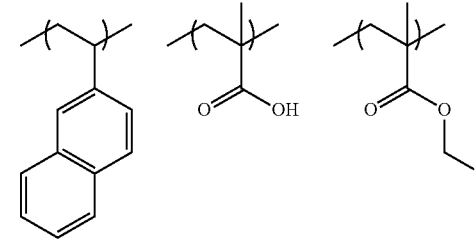
(a-106)
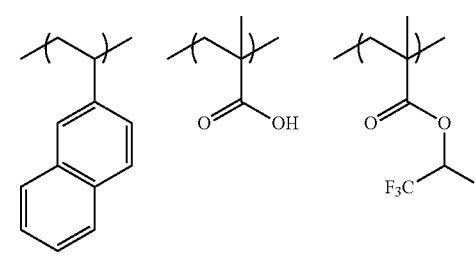
(a-107)
(a-108)

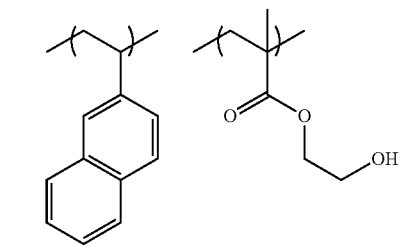 (a-109)
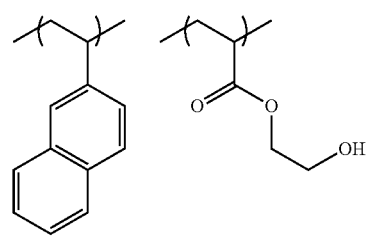 (a-110)
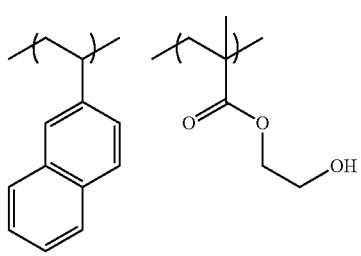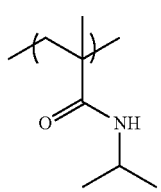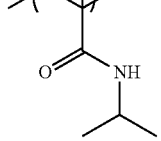 (a-111)
(a-112)
(a-113)
(a-114)
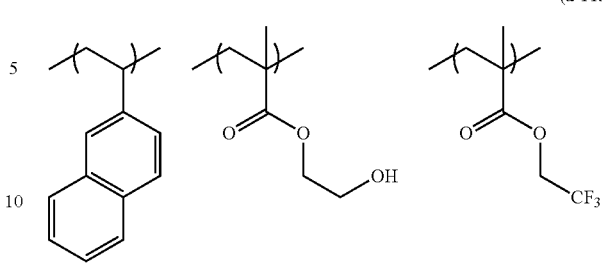 (a-115)
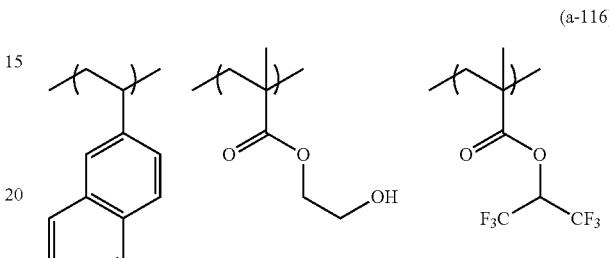 (a-116)
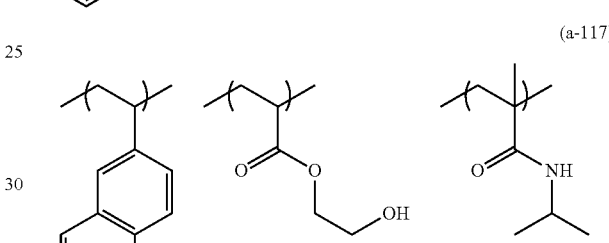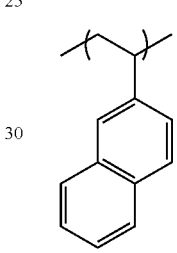 (a-117)
(a-118)
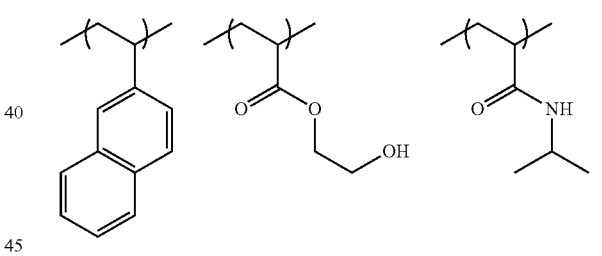 (a-119)
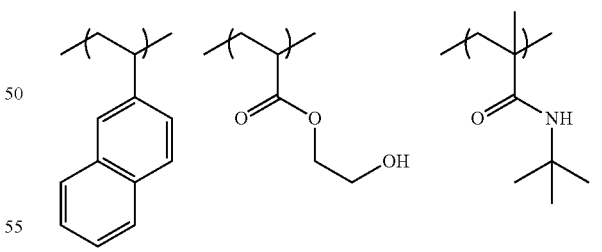 (a-120)
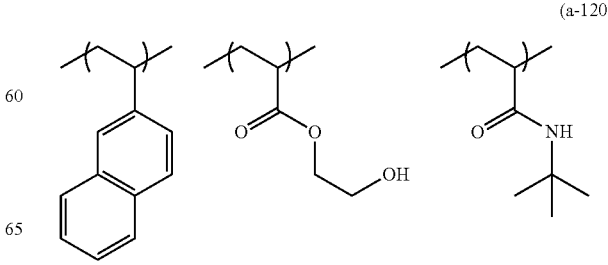

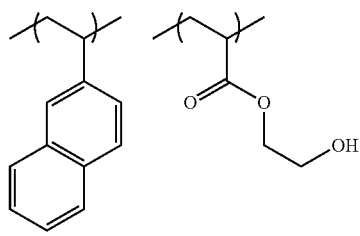

(a-121)

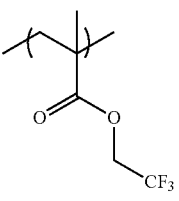

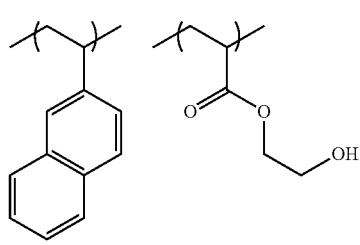

(a-122)

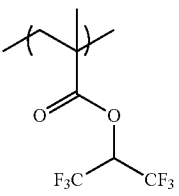

As Polymer 1 having a structure unit of Formula (A), a polymer including at least one structure unit selected from the group consisting of a structure unit derived from tert-butylstyrene, a structure unit derived from tert-butoxystyrene, and a structure unit derived from 2-vinylnaphthalene and at least one structure unit selected from the group consisting of a structure unit derived from (meth)acrylic acid, a structural unit derived from hydroxyethyl (meth)acrylate, and a structural unit derived from hydroxypropyl (meth)acrylate is preferable.

[Polymer Having Structure Unit of any One of Formulas (1-1) to (1-4) (Polymer 2)]

As the polymer of the component A, a polymer having the structure unit of any one of Formulas (1-1) to (1-4) (hereinafter referred to as Polymer 2) can be suitably used. The polymer having the structure unit of Formulas (1-1) to (1-4) can be a polymer including further a linear or branched alkyl group having a carbon atom number of 1 to 10 in which a halogen atom is optionally substituted for at least one hydrogen atom.

Polymer 2 may be a polymer including only one of the structure units (a single structure unit) of Formulas (1-1) to (1-4), or a polymer including one of or two or more of the structure units of Formulas (1-1) to (1-4).

Among the structure units of Formulas (1-1) to (1-4) included in Polymer 2, the structure unit of Formula (1-1) is particularly preferable. The kinds of the structure units of Polymer 2 are preferably 2 to 5, more preferably 2 to 4, and most preferably 2 or 3.

In Formulas (1-1) to (1-4), the $C_{6-18}$ aromatic ring included in the divalent, tetravalent, hexavalent, or octavalent organic group of $Ar^1$ or the divalent organic group of $Ar^2$ is, for example, an aromatic hydrocarbon ring or a heteroaromatic ring. Examples of the aromatic hydrocarbon ring include benzene, naphthalene, anthracene, phenanthrene, naphthacene, triphenylene, pyrene, and chrysene. Benzene, naphthalene, anthracene, and pyrene are preferable. Examples of the heteroaromatic ring include furan, thiophene, pyrrole, imidazole, pyran, pyridine, pyrimidine, pyrazine, indole, purine, quinoline, isoquinoline, quinuclidine, chromene, thianthrene, phenothiazine, phenoxazine, xanthene, acridine, phenazine, and carbazole. Carbazole is preferable.

In Formulas (2-1) to (2-5), Formula (3-1) and Formula (3-2), $R^3$ to $R^4$, $R^{16}$, and $R^{17}$ are each independently a linear, branched, or cyclic alkyl group having a carbon atom number of 1 to 10, a linear or branched alkoxy group having a carbon atom number of 1 to 9, a halogen atom, nitro group, cyano group, acetoxy group, methylthio group, or amino group. Examples of the linear, branched, or cyclic alkyl group having a carbon atom number of 1 to 10 include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, cyclohexyl group, cycloheptyl group, cyclooctyl group, cyclononyl group, cyclodecanyl group, norbornyl group, adamantyl group, bicyclo[2.1.0]pentyl group, bicyclo[3.2.1]octyl group, and tricyclo[3.2.1.0$^{2,7}$] octyl group.

A halogen atom may be substituted for at least one hydrogen atom of the linear, branched, or cyclic alkyl group having a carbon atom number of 1 to 10. Examples of the halogen atom include a fluorine atom, a chlorine atom, a bromine atom, and an iodine atom. The alkyl group in which a halogen atom is substituted for at least one hydrogen atom is preferably methyl group, ethyl group, n-propyl group, i-propyl group, n-butyl group, i-butyl group, s-butyl group, and t-butyl group, in all of which a fluorine atom is substituted for at least one hydrogen atom. Trifluoromethyl group is the most preferable substituted alkyl group.

Examples of the linear or branched alkoxy group having a carbon atom number of 1 to 9 include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, 1-ethyl-2-methyl-n-propoxy group, n-heptyloxy group, n-octyloxy group, and n-nonyloxy group.

In Formulas (2-1) to (2-5), Formula (3-1), and Formula (3-2), r3 to r14, r16, and r17, and t3 to t14, t16, and t17 are the number of substituents. When m1 to m4 are 0, the substituent is a benzene ring, when m1 to m4 are 1, substituent is a naphthalene ring, and when m1 to m4 are 3, the substituent is an anthracene ring. m1 to m4 are preferably 0 or 1. The maximum number of the substituents varies depending on the type of the aromatic ring included in the divalent organic group of $Ar^1$ or the divalent organic group of $Ar^2$. As the number of the substituents, r3, r6, r7, r16, r17, t3, t6, t7, t16 and t17 are preferably an integer of 1 to 4. The sum of r3 and t3, the sum of r4 and t4, the sum of r5 and t5, the sum of r6 and t6, the sum of r7 and t7, the sum of r8 and t8, the sum of r9 and t9, the sum of r10 and t110, the sum of r11 and t11, the sum of r12 and t12, the sum of r13 and t13, the sum of r14 and t14, the sum of r16 and t16, and the sum of r17 and t17 are preferably integers of 1 to 5.

In Formulas (2-3) and (2-4), $Q_1$ and $Q_2$ are each independently a single bond, an oxygen atom, a sulfur atom, sulfonyl group, carbonyl group, imino group, a $C_{6-40}$ arylene group, or a linear, branched, or cyclic alkylene group having a carbon atom number of 1 to 10. $Q_1$ and $Q_2$ are preferably a single bond.

Examples of the $C_{6-40}$ arylene group include phenylene group, o-methylphenylene group, m-methylphenylene group, p-methylphenylene group, o-chlorophenylene group, m-chlorophenylene group, p-chlorophenylene group, o-fluorophenylene group, p-fluorophenylene group, o-methoxyphenylene group, p-methoxyphenylene group, p-nitrophenylene group, p-cyanophenylene group, c-naphthylene group, β-naphthylene group, o-biphenylylene group, m-biphenylylene group, p-biphenylylene group, 1-anthrylene group, 2-anthrylene group, 9-anthrylene group, 1-phenanthrylene group, 2-phenanthrylene group, 3-phenanthrylene group, 4-phenanthrylene group, and 9-phenanthrylene group.

Examples of the linear, branched, or cyclic alkylene group having the carbon atom number of 1 to 10 include methylene group, ethylene group, n-propylene group, isopropylene group, cyclopropylene group, n-butylene group, isobutylene group, s-butylene group, t-butylene group, cyclobutylene group, 1-methyl-cyclopropylene group, 2-methyl-cyclopropylene group, n-pentylene group, 1-methyl-n-butylene group, 2-methyl-n-butylene group, 3-methyl-n-butylene group, 1,1-dimethyl-n-propylene group, 1,2-dimethyl-n-propylene group, 2,2-dimethyl-n-propylene group, 1-ethyl-n-propylene group, cyclopentylene group, 1-methyl-cyclobutylene group, 2-methyl-cyclobutylene group, 3-methyl-cyclobutylene group, 1,2-dimethyl-cyclopropylene group, 2,3-dimethyl-cyclopropylene group, 1-ethyl-cyclopropylene group, 2-ethyl-cyclopropylene group, n-hexylene group, 1-methyl-n-pentylene group, 2-methyl-n-pentylene group, 3-methyl-n-pentylene group, 4-methyl-n-pentylene group, 1,1-dimethyl-n-butylene group, 1,2-dimethyl-n-butylene group, 1,3-dimethyl-n-butylene group, 2,2-dimethyl-n-butylene group, 2,3-dimethyl-n-butylene group, 3,3-dimethyl-n-butylene group, 1-ethyl-n-butylene group, 2-ethyl-n-butylene group, 1,1,2-trimethyl-n-propylene group, 1,2,2-trimethyl-n-propylene group, 1-ethyl-1-methyl-n-propylene group, 1-ethyl-2-methyl-n-propylene group, cyclohexylene group, 1-methyl-cyclopentylene group, 2-methyl-cyclopentylene group, 3-methyl-cyclopentylene group, 1-ethyl-cyclobutylene group, 2-ethyl-cyclobutylene group, 3-ethyl-cyclobutylene group, 1,2-dimethyl-cyclobutylene group, 1,3-dimethyl-cyclobutylene group, 2,2-dimethyl-cyclobutylene group, 2,3-dimethyl-cyclobutylene group, 2,4-dimethyl-cyclobutylene group, 3,3-dimethyl-cyclobutylene group, 1-n-propyl-cyclopropylene group, 2-n-propyl-cyclopropylene group, 1-isopropyl-cyclopropylene group, 2-isopropyl-cyclopropylene group, 1,2,2-trimethyl-cyclopropylene group, 1,2,3-trimethyl-cyclopropylene group, 2,2,3-trimethyl-cyclopropylene group, 1-ethyl-2-methyl-cyclopropylene group, 2-ethyl-1-methyl-cyclopropylene group, 2-ethyl-2-methyl-cyclopropylene group, 2-ethyl-3-methyl-cyclopropylene group, n-heptylene group, n-octylene group, n-nonylene group, n-decanylene group, 1,2-cyclopentylene group, 1,3-cyclopentylene group, 1,2-cyclohexylene group, 1,3-cyclohexylene group, and 1,4-cyclohexylene group.

A halogen atom may be substituted for at least one hydrogen atom of the linear, branched, or cyclic alkylene group having a carbon atom number of 1 to 10. Examples of the halogen atom include a fluorine atom, a chlorine atom, a bromine atom, and an iodine atom.

Each of the tertiary carbon atom bonded to the aromatic ring in Formula (3-1) and the two methylene groups bonded to the aromatic ring in Formula (3-2) are parts involved with bonding to the divalent, tetravalent, hexavalent, or octavalent organic group of $Ar^1$.

Polymer 2 is suitably obtained by reacting a monomer for constituting the divalent, tetravalent, hexavalent, or octavalent organic group of $Ar^1$ and a monomer for constituting the divalent organic group of $Ar^2$.

Specific examples of the monomer for constituting the divalent, tetravalent, hexavalent, or octavalent organic group of $Ar^1$ include compounds of (Formula 3-1-1) to (Formula 3-1-26), (Formula 4-1-1) to (Formula 4-1-10), (Formula 4-13) to (Formula 4-39), and (Formula 5-1) to (Formula 5-19).

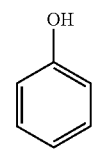

(Formula 3-1-1)

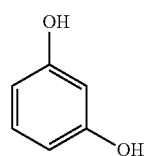

(Formula 3-1-2)

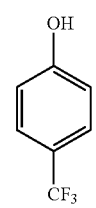

(Formula 3-1-3)

(Formula 3-1-4)
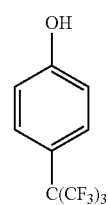
(Formula 3-1-5)
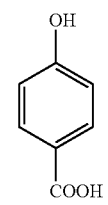
(Formula 3-1-6)
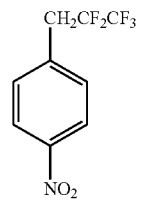
(Formula 3-1-7)
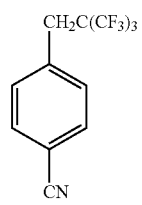
(Formula 3-1-8)
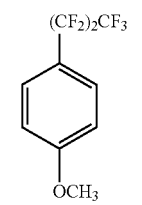
(Formula 3-1-9)
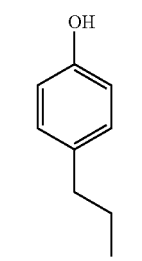
(Formula 3-1-10)
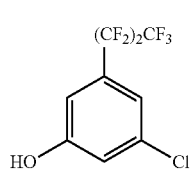
(Formula 3-1-11)
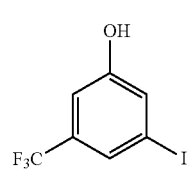
(Formula 3-1-12)
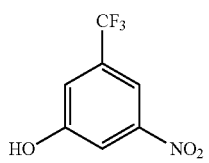
(Formula 3-1-13)
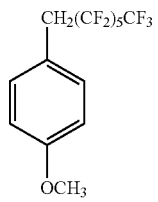
(Formula 3-1-14)
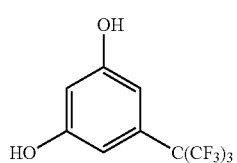
(Formula 3-1-15)
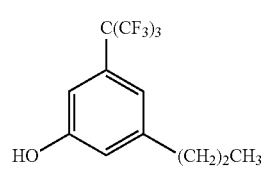
(Formula 3-1-16)
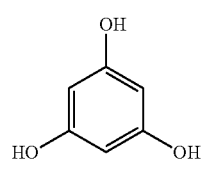
(Formula 3-1-17)
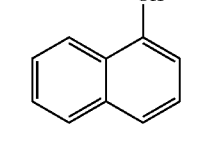
(Formula 3-1-18)
(Formula 3-1-19)
(Formula 3-1-20)
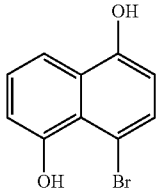

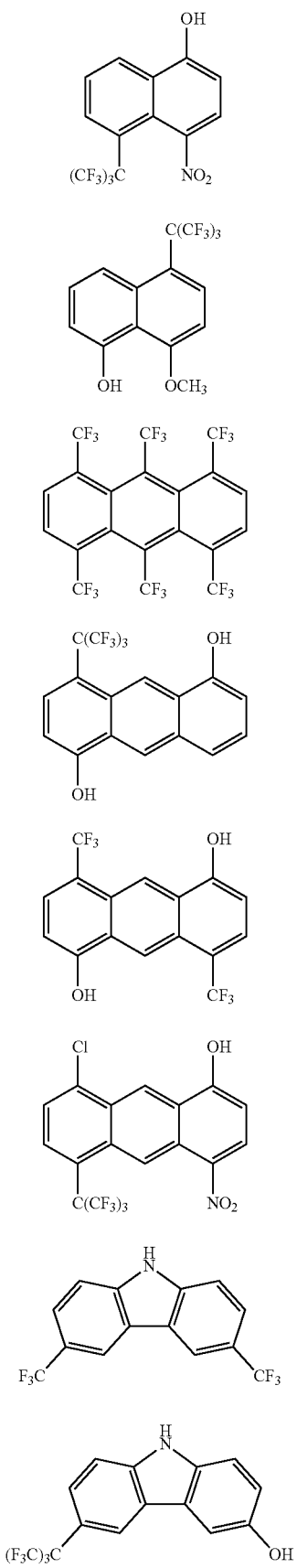
(Formula 3-1-21)
(Formula 3-1-22)
(Formula 3-1-23)
(Formula 3-1-24)
(Formula 3-1-25)
(Formula 3-1-26)
(Formula 4-1-1)
(Formula 4-1-2)
(Formula 4-1-3)
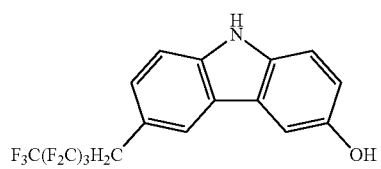
(Formula 4-1-4)
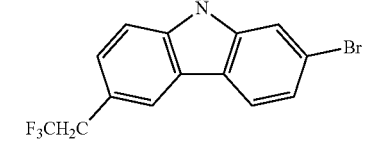
(Formula 4-1-5)
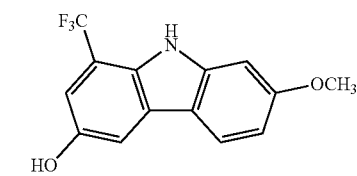
(Formula 4-1-6)
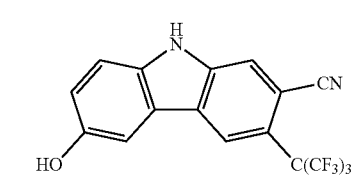
(Formula 4-1-7)
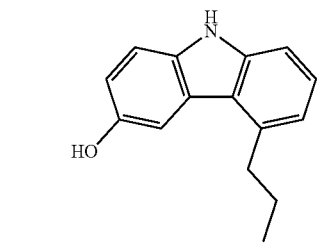
(Formula 4-1-8)
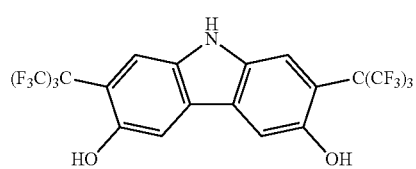
(Formula 4-1-9)
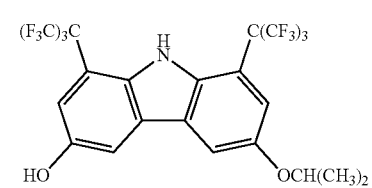
(Formula 4-1-10)
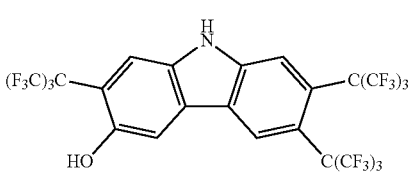
(Formula 4-13)
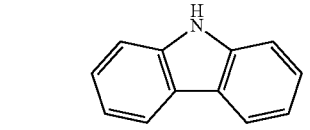

(Formula 4-14)
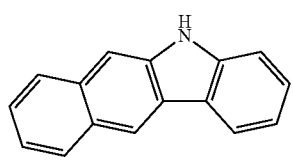
(Formula 4-15)
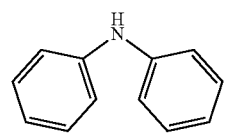
(Formula 4-16)
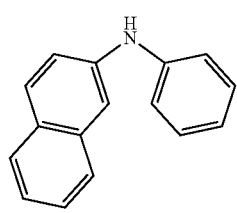
(Formula 4-17)
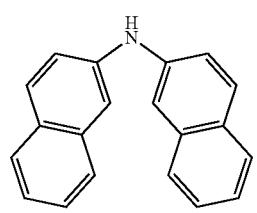
(Formula 4-18)
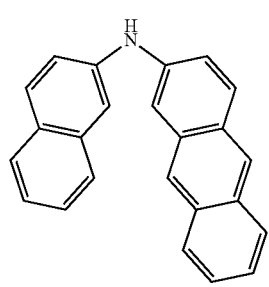
(Formula 4-19)
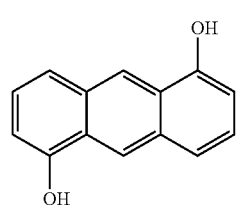
(Formula 4-20)
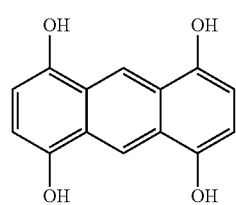
(Formula 4-21)
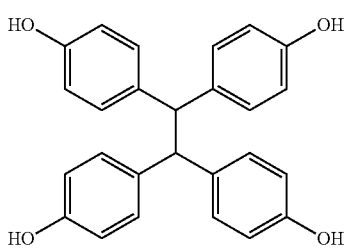
(Formula 4-22)
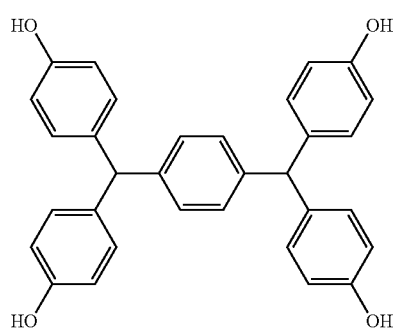
(Formula 4-23)
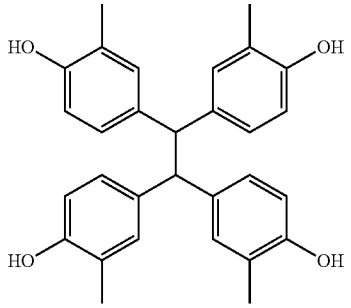
(Formula 4-24)
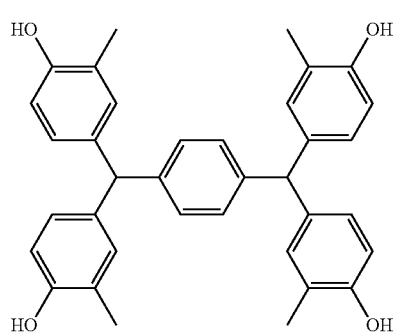
(Formula 4-25)
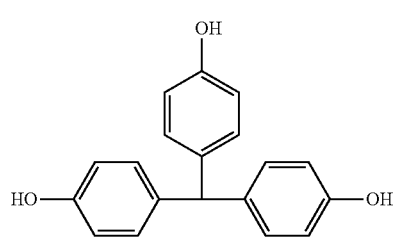

(Formula 4-26)
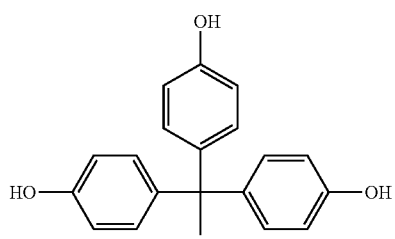
(Formula 4-27)
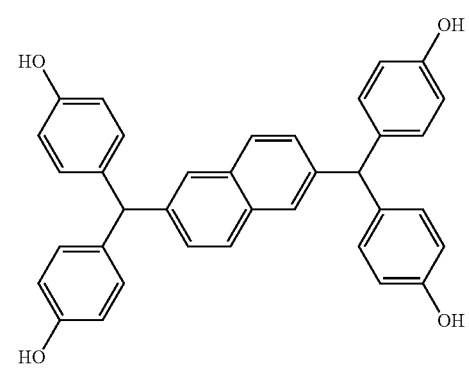
(Formula 4-28)
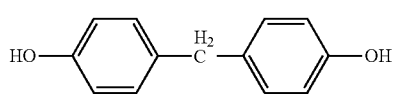
(Formula 4-29)
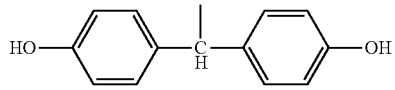
(Formula 4-30)
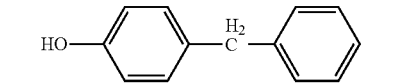
(Formula 4-31)
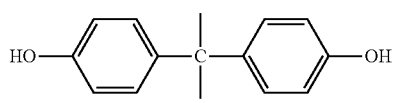
(Formula 4-32)
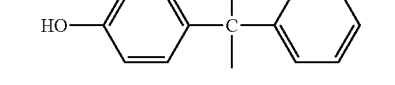
(Formula 4-33)
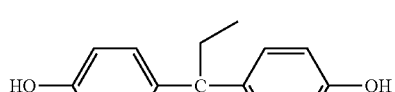
(Formula 4-34)
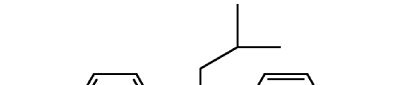
(Formula 4-35)
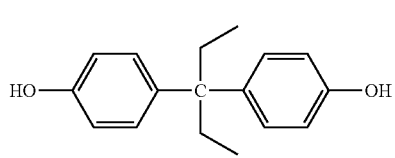
(Formula 4-36)
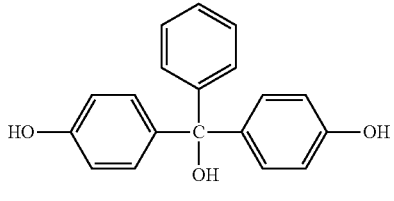
(Formula 4-37)
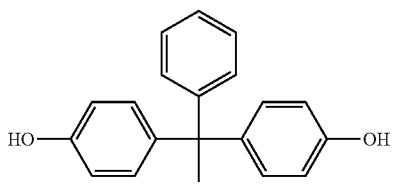
(Formula 4-38)
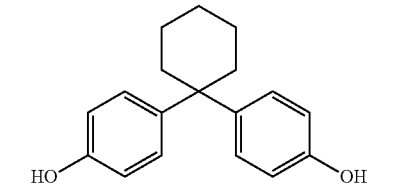
(Formula 4-39)
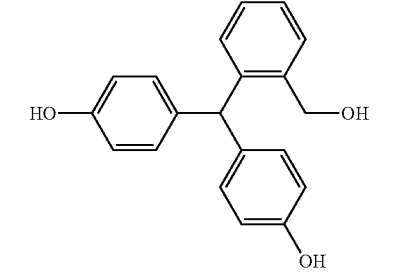
(Formula 5-1)
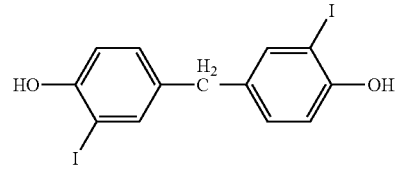
(Formula 5-2)
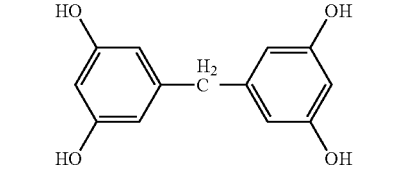
(Formula 5-3)
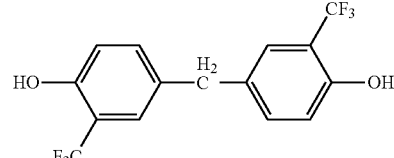
(Formula 5-4)
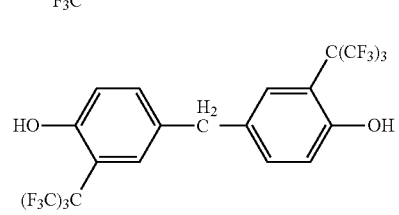

(Formula 5-5) 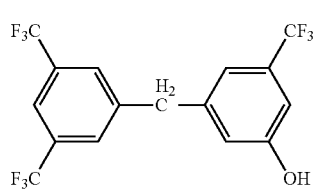
(Formula 5-6) 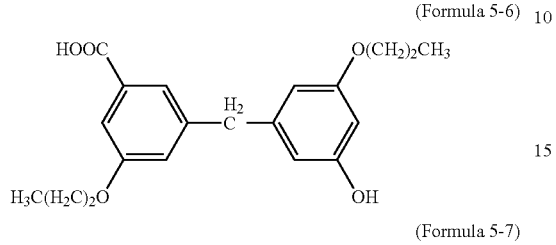
(Formula 5-7) 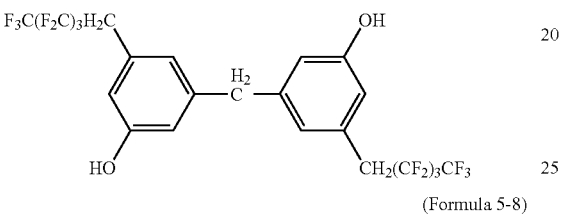
(Formula 5-8) 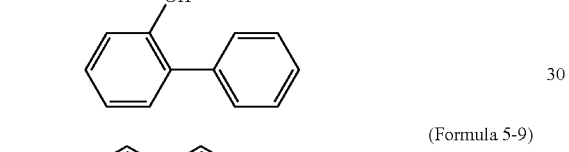
(Formula 5-9) 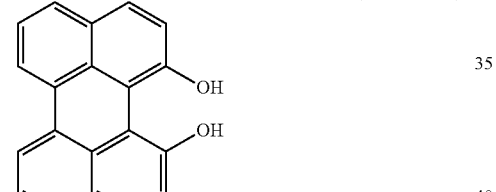
(Formula 5-10) 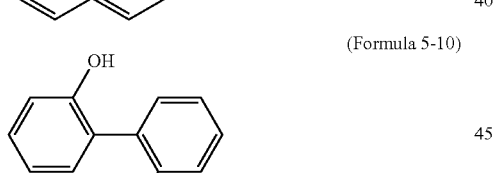
(Formula 5-11) 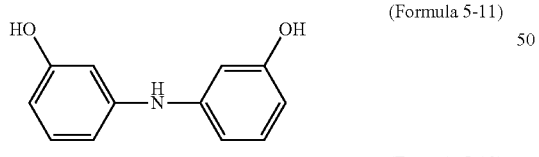
(Formula 5-12) 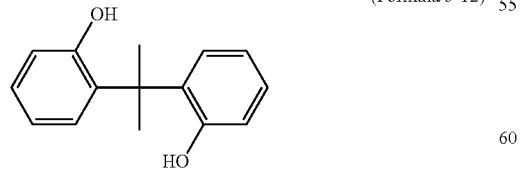
(Formula 5-13) 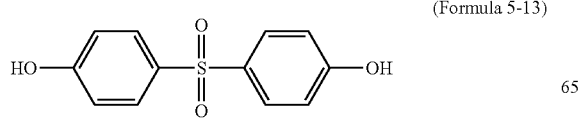
(Formula 5-14) 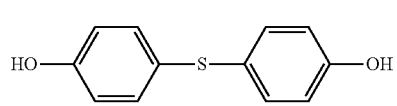
(Formula 5-15) 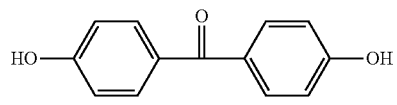
(Formula 5-16) 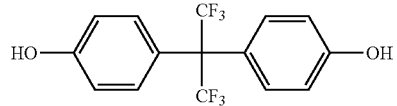
(Formula 5-17) 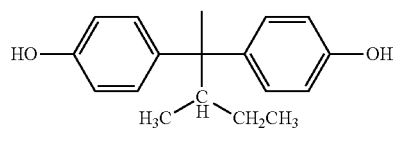
(Formula 5-18) 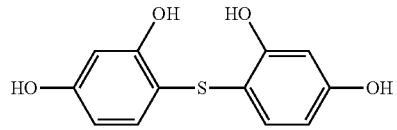
(Formula 5-19) 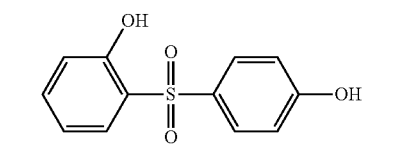
Specific examples of the monomer for constituting the divalent organic group of $Ar^2$ include compounds of (Formula 6-1) to (Formula 6-37) having an aldehyde group and compounds of (Formula 7-1) to (Formula 7-15) having methylol group.
(Formula 6-1) 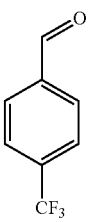
(Formula 6-2) 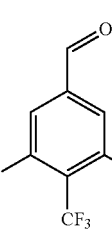

(Formula 6-3)
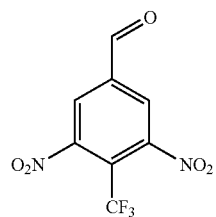
(Formula 6-4)
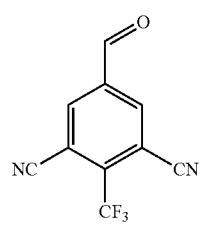
(Formula 6-5)
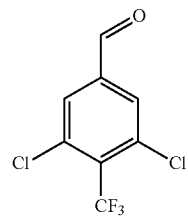
(Formula 6-6)
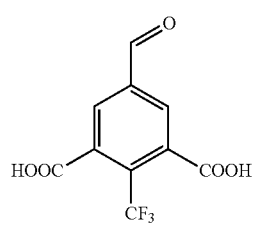
(Formula 6-7)
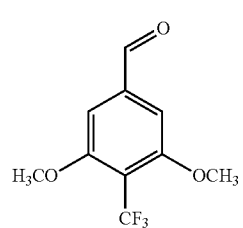
(Formula 6-8)
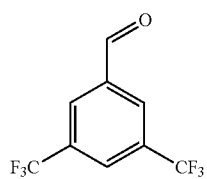
(Formula 6-9)
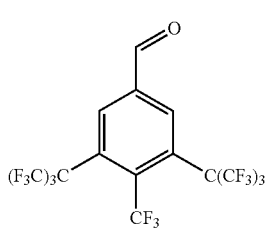
(Formula 6-10)
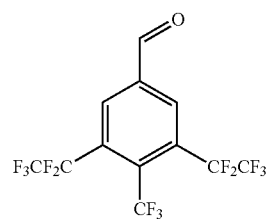
(Formula 6-11)
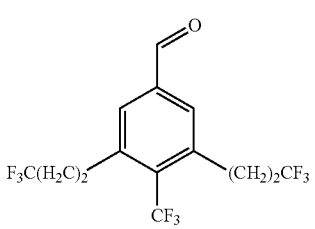
(Formula 6-12)
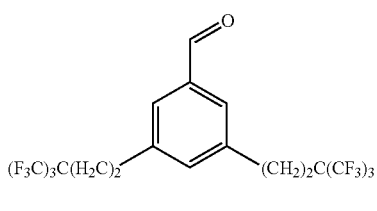
(Formula 6-13)
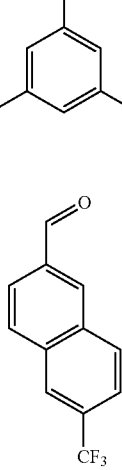
(Formula 6-14)
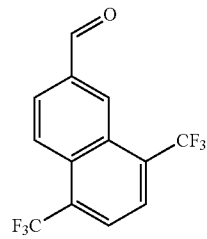
(Formula 6-15)
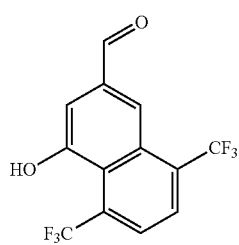

(Formula 6-16)
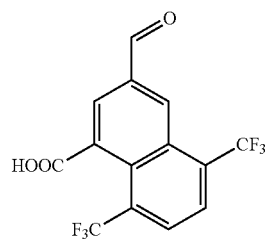
(Formula 6-17)
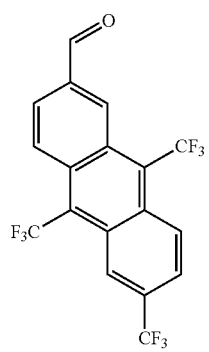
(Formula 6-18)
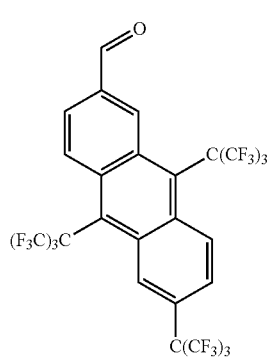
(Formula 6-19)
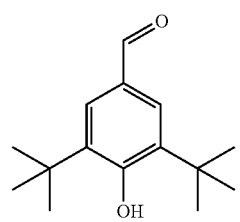
(Formula 6-20)
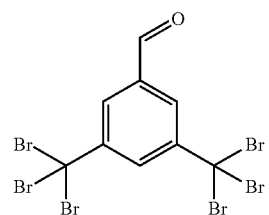
(Formula 6-21)
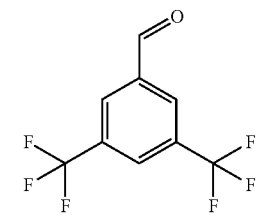
(Formula 6-22)
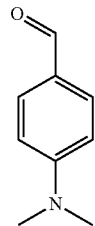
(Formula 6-23)
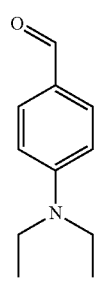
(Formula 6-24)
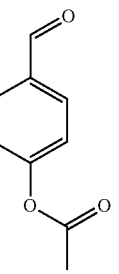
(Formula 6-25)
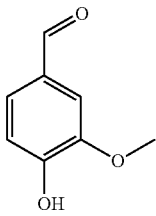
(Formula 6-26)
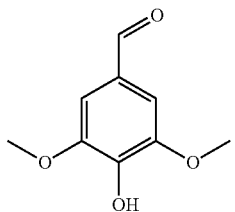
(Formula 6-27)
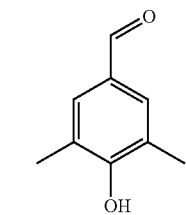

(Formula 6-28)
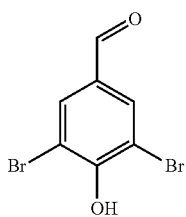
(Formula 6-29)
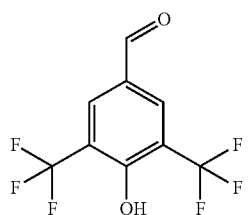
(Formula 6-30)
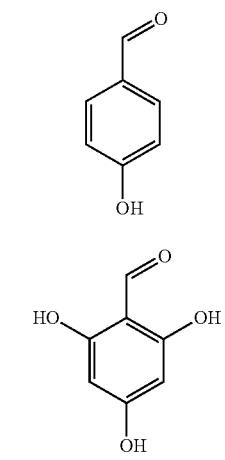
(Formula 6-31)
(Formula 6-32)
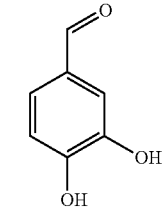
(Formula 6-33)
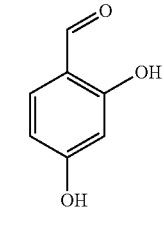
(Formula 6-34)
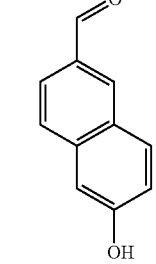
(Formula 6-35)
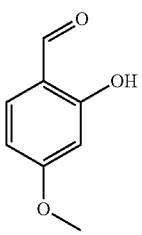
(Formula 6-36)
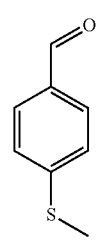
(Formula 6-37)
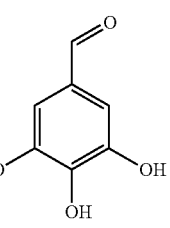
(Formula 7-1)
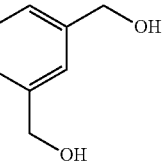
(Formula 7-2)
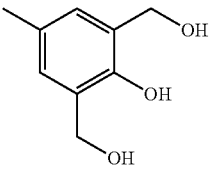
(Formula 7-3)
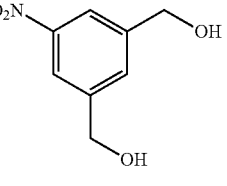
(Formula 7-4)
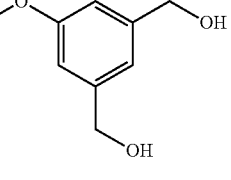
(Formula 7-5)
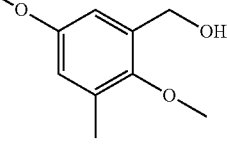

(Formula 7-6)
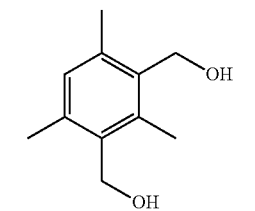

(Formula 7-7)
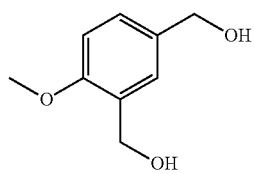

(Formula 7-8)
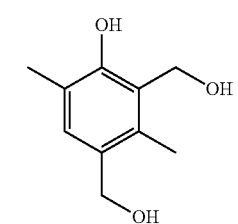

(Formula 7-9)
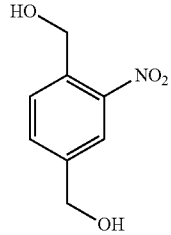

(Formula 7-10)
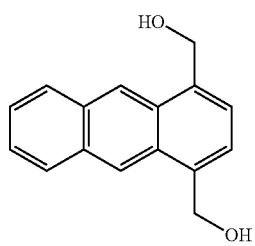

(Formula 7-11)
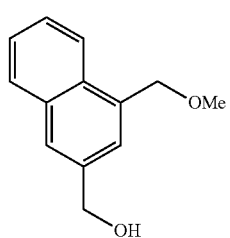

(Formula 7-12)
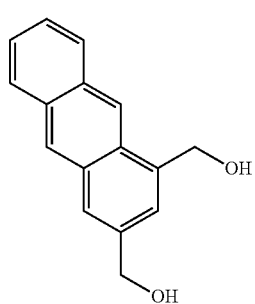

(Formula 7-13)
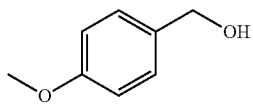

(Formula 7-14)
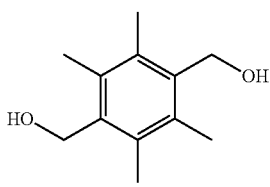

(Formula 7-15)
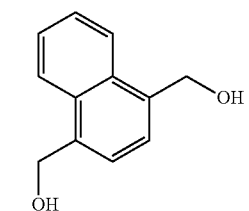

Among them, the monomer for constituting the divalent organic group of $Ar^1$ is preferably a monomer having phenolic hydroxy group and the monomer for constituting the divalent organic group of $Ar^2$ is preferably a monomer having aldehyde group.

Specific examples of the structure unit of any one of Formulas (1-1) to (1-4) included in Polymer 2 include structure units of (Formula 10-1) to (Formula 10-36). The structure units, however, are not limited to these examples.

(Formula 10-1)

(Formula 10-2)
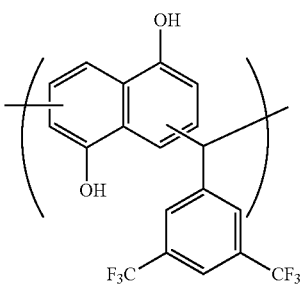

-continued
(Formula 10-3)
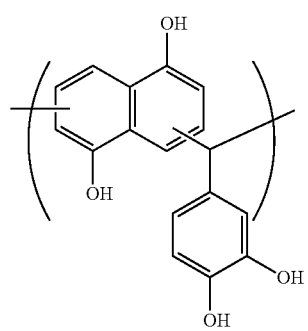
(Formula 10-4)
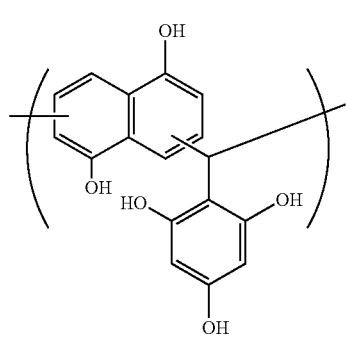
(Formula 10-5)
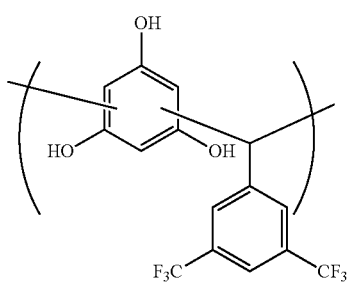
(Formula 10-6)
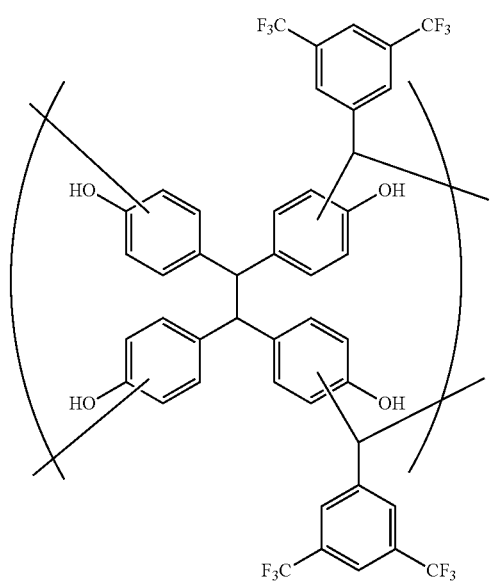
(Formula 10-7)
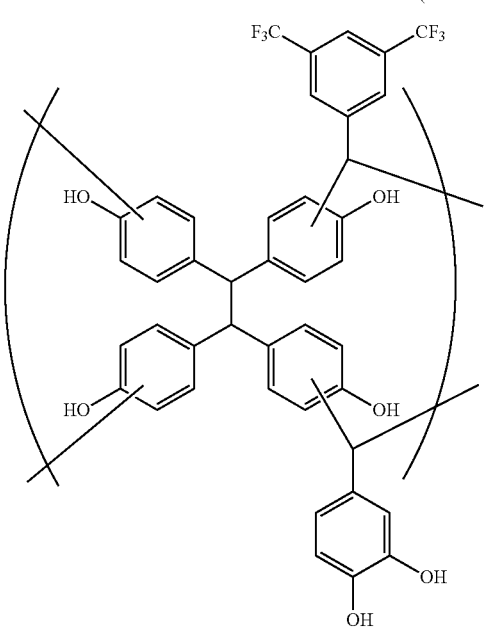
(Formula 10-8)
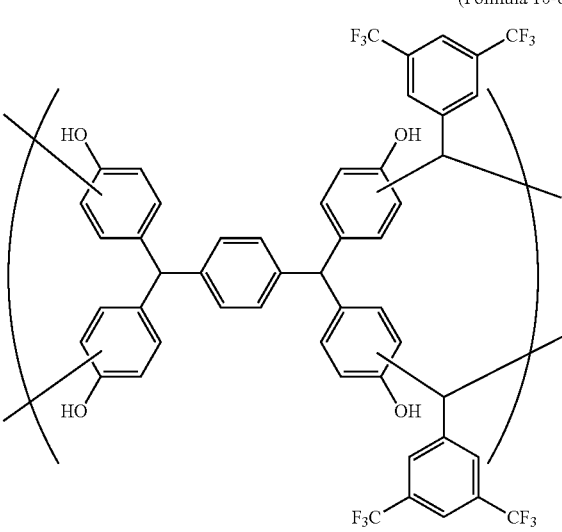

(Formula 10-9)
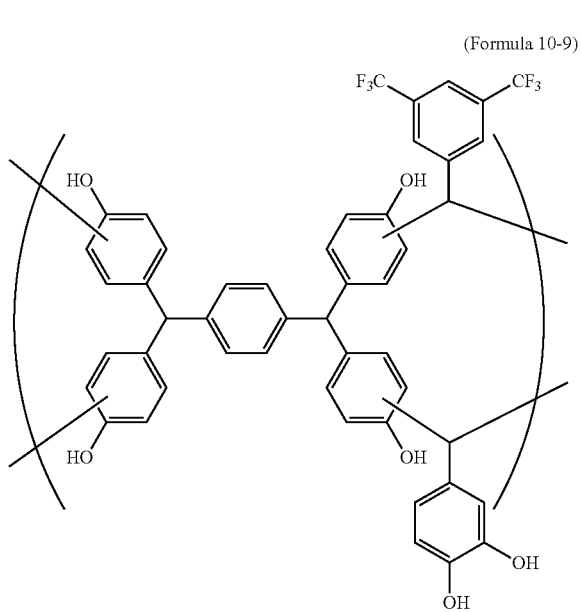
(Formula 10-10)
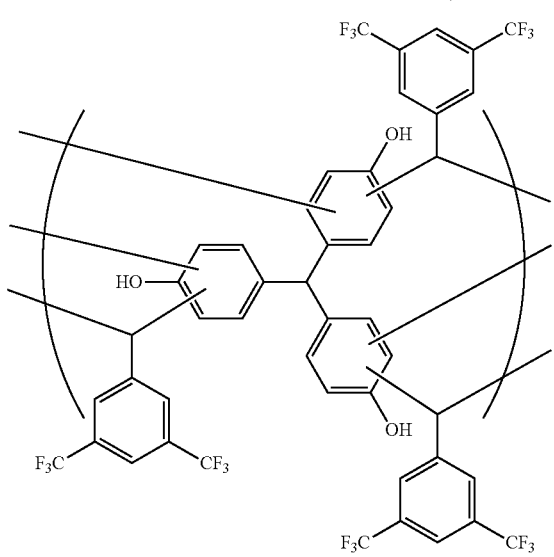
(Formula 10-11)
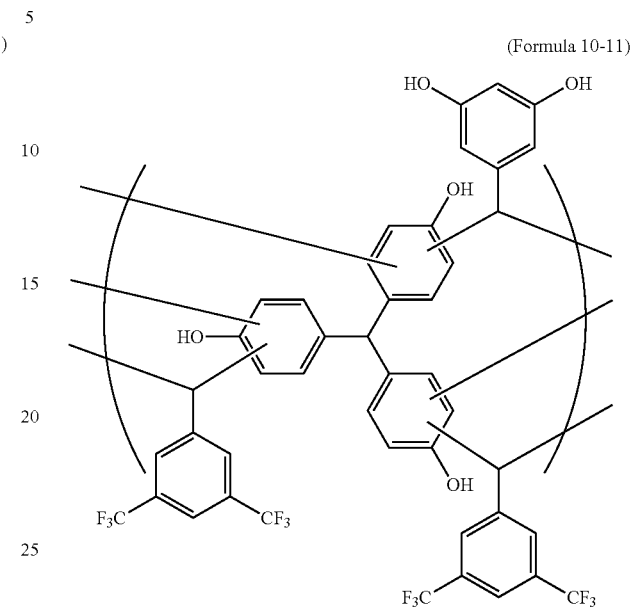
(Formula 10-12)
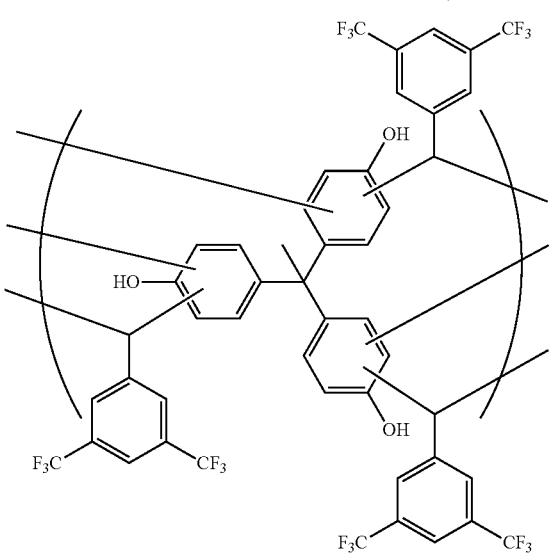

(Formula 10-13)
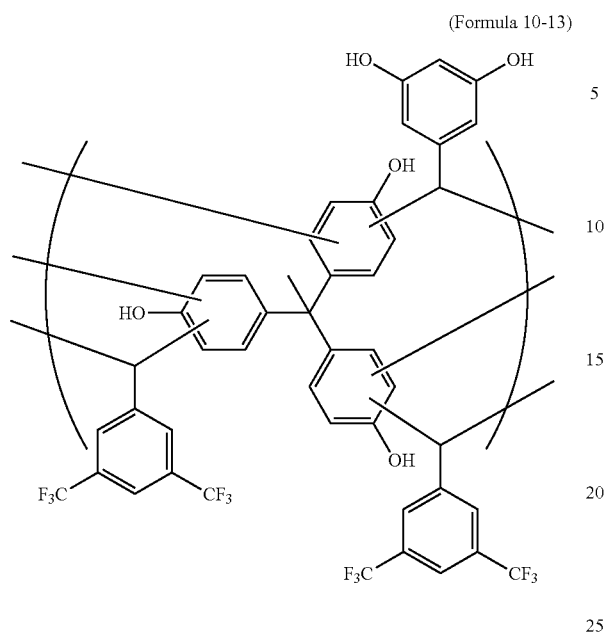
(Formula 10-14)
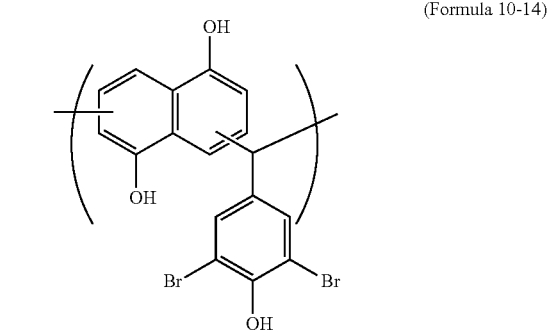
(Formula 10-15)
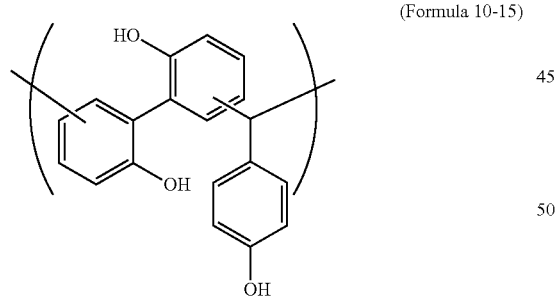
(Formula 10-16)
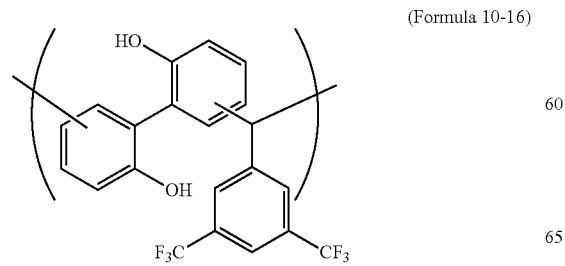
(Formula 10-17)
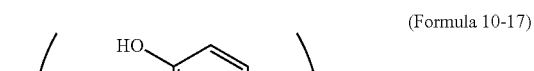
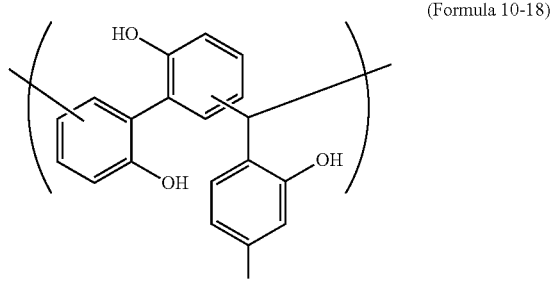
(Formula 10-18)
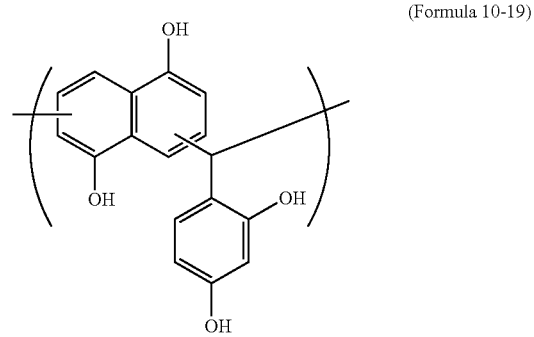
(Formula 10-19)
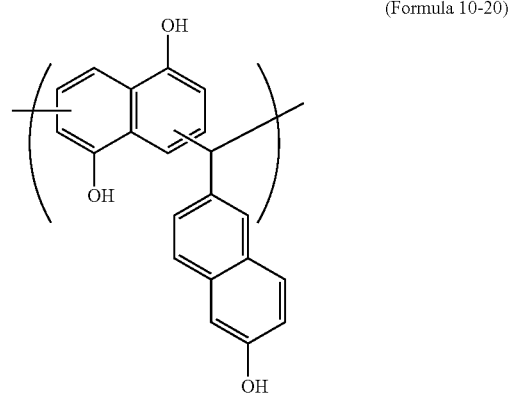
(Formula 10-20)
(Formula 10-21)
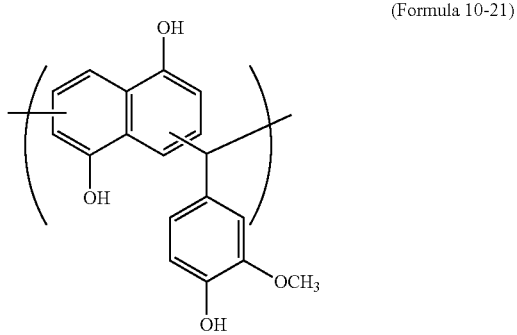

-continued
(Formula 10-22)
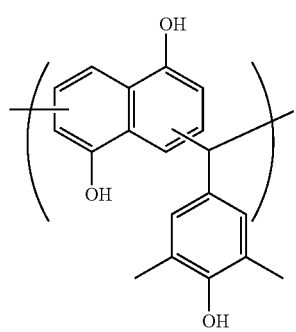
(Formula 10-26)
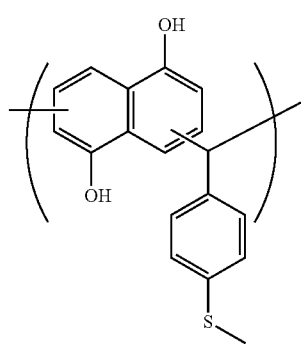
(Formula 10-23)
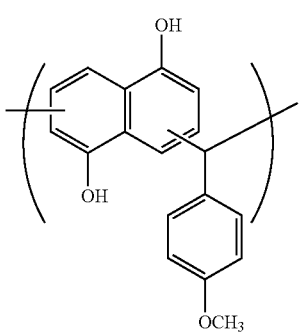
(Formula 10-27)
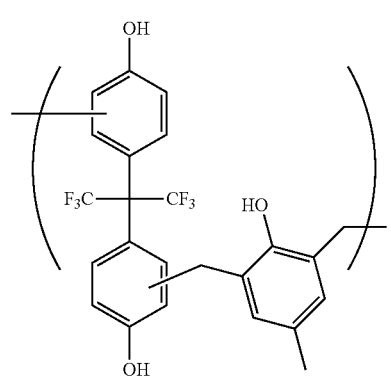
(Formula 10-24)
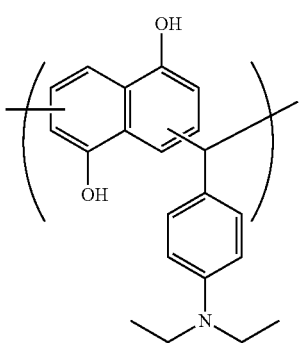
(Formula 10-28)
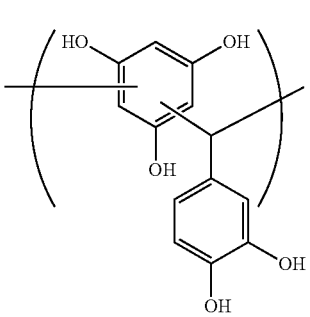
(Formula 10-25)
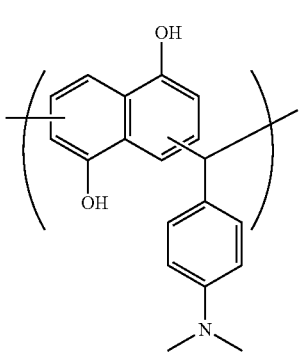
(Formula 10-29)
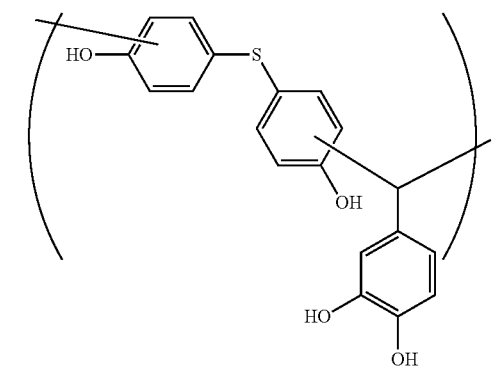

(Formula 10-30)
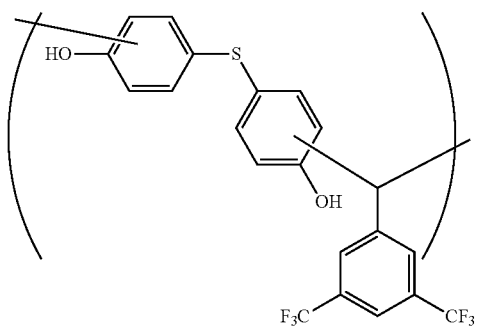

(Formula 10-31)
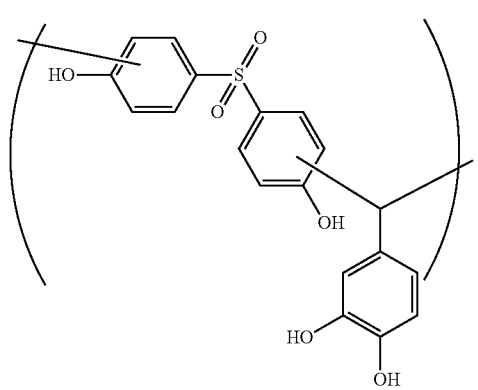

(Formula 10-32)
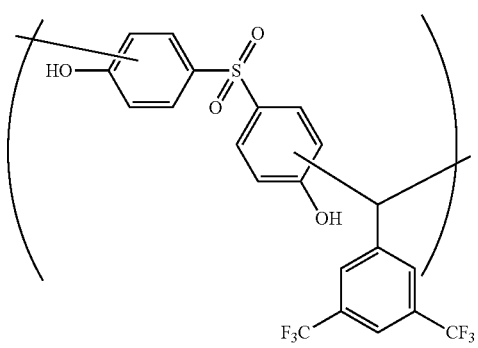

(Formula 10-33)
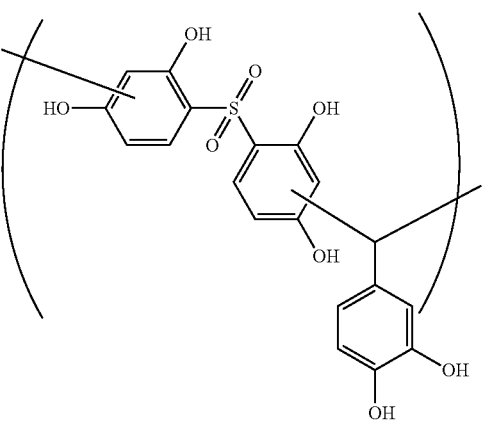

(Formula 10-34)
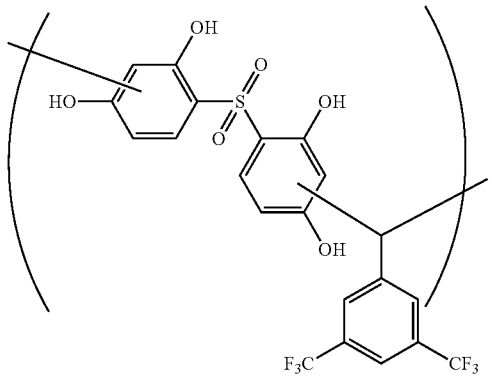

(Formula 10-35)
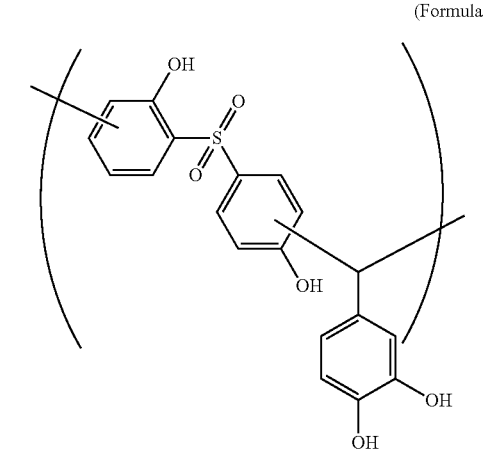

(Formula 10-36)
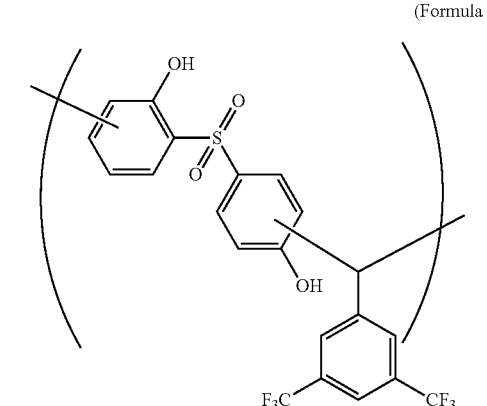

As a method for synthesizing Polymer 2 included in the coating liquid for resist pattern coating of the present invention, the method for carrying out condensation polymerization of "monomer A group" that is a group of monomers constituting $Ar^1$ and a "monomer B group" that is a group of monomers constituting $Ar^2$ in the presence of an acid catalyst is generally employed. One monomer or two or more monomers are selected from each of the monomer A group or the monomer B group. Three or less monomers are preferably and two or less of monomers are more preferably selected from each of the groups. At the time of the synthesis of Polymer 2, the charged molar ratio of the monomer selected from the monomer A group to the monomer selected from the monomer B group (monomer A group/monomer B group) may be, for example, 20/100 to 80/20 and more preferably 20/80 to 70/30.

The monomer A group or the monomer B group preferably includes a monomer including an alkyl group or an alkylene group in which a fluorine atom is substituted for at least one hydrogen atom.

When the monomer A group or the monomer B group includes two or more monomers, the charged molar ratio of the monomer including an alkyl group or an alkylene group in which a fluorine atom is substituted for at least one hydrogen atom included in the monomer A group or the monomer B group is, for example, 1/10 to 1 and more preferably 1/5 to 1.

When the monomer A group or the monomer B group includes two or more monomers, the charged molar ratio of each of the two or more monomers to the whole monomer A group or the whole monomer B group may be 1/20 or more and more preferably 1/10 or more.

The reaction of the monomer A group with the monomer B group is desirably carried out in a nitrogen atmosphere. The reaction temperature can be selected from any temperature of 50° C. to 200° C. and preferably 80° C. to 180° C. A high molecular weight polymer can be obtained with a reaction time of 1 hour to 48 hours. In order to obtain a polymer having a low molecular weight and high storage stability, the reaction is more preferably carried out at a reaction temperature of 80° C. to 150° C. for a reaction time of 1 hour to 24 hours.

<Component B: Sulfonic Acid>

The sulfonic acid included in the coating liquid for resist pattern coating of the present invention is a compound of A-SO$_3$H (where A is a linear or branched alkyl group or fluorinated alkyl group having a carbon atom number of 1 to 16, an aromatic group having at least one of the alkyl group or the fluorinated alkyl group as a substituent, or a $C_{4-16}$ alicyclic group optionally having a substituent such as methyl group or ethyl group). Examples of such sulfonic acids include octylbenzenesulfonic acid, nonylbenzenesulfonic acid, decylbenzenesulfonic acid, undecylbenzenesulfonic acid, dodecylbenzenesulfonic acid (alias name: laurylbenzenesulfonic acid), (1,3,5,7-tetramethyloctyl)benzenesulfonic acid, tridecylbenzenesulfonic acid, (1R)-(−)-10-camphorsulfonic acid, (1S)-(+)-10-camphorsulfonic acid, trifluoromethanesulfonic acid, perfluorobutanesulfonic acid, perfluorooctanesulfonic acid, and nonafluoro-1-butanesulfonic acid.

Among these sulfonic acids, as a component included in the coating liquid for resist pattern coating of the present invention, the sulfonic acids are preferably sulfonic acids in which the group of A is a linear or branched alkyl group having a carbon atom number of 4 to 12 or a fluoroalkyl group or phenyl group having at least one of the alkyl groups or the fluoroalkyl groups as a substituent in the formula of the sulfonic acid. Dodecylbenzenesulfonic acid and nonafluoro-1-butanesulfonic acid are preferably used.

The content ratio of the sulfonic acid is, for example, 0.5% by mass to 80% by mass, preferably 0.5% by mass to 60% by mass, or 20% by mass to 60% by mass relative to the polymer of the component (A).

<C: Organic Solvent>

The organic solvent included in the coating liquid for resist pattern coating of the present invention includes a compound of $R^1$—O—$R^2$ and/or $R^1$—C(=O)—$R^2$ (where $R^1$ is a linear, branched, or cyclic alkyl group or fluorinated alkyl group having a carbon atom number of 3 to 16; and $R^2$ is a linear, branched, or cyclic alkyl group or fluorinated alkyl group having a carbon atom number of 1 to 16) and is required to be capable of dissolving the polymer of the component A (Polymer 1 and Polymer 2). Examples of the organic solvent include isopropyl ether (alias name: diisopropyl ether), propyl ether (alias name: dipropyl ether), isoamyl ether (alias name: diisoamyl ether), amyl ether (alias name: diamyl ether), dibutyl ether (alias name: butyl ether), diisobutyl ether (alias name: isobutyl ether), sec-butyl ether (alias name: di-sec-butyl ether), hexyl ether (alias name: dihexyl ether), bis(2-ethylhexyl) ether, decyl ether (alias name: didecyl ether), undecyl ether (alias name: diundecyl ether), dodecyl ether (alias name: didodecyl ether), tetradecyl ether (alias name: ditetradecyl ether), hexadecyl ether, butyl methyl ether, butyl ethyl ether, butyl propyl ether, tert-butyl methyl ether, tert-butyl ethyl ether, tert-butyl propyl ether, di-tert-butyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, cyclohexyl-tert-butyl ether, 2-octanone, and 4-heptanone. Among these organic solvents, isoamyl ether and 2-octanone are preferably used as components included in the coating liquid for resist pattern coating of the present invention.

The content ratio of the solid content obtained by removing the organic solvent and optionally contained water from the coating liquid for resist pattern coating of the present invention is, for example, 0.5% by mass to 30% by mass and preferably 2% by mass to 15% by mass compared to the coating liquid.

[Method for Forming Resist Pattern]

The present invention also includes a method of forming a resist pattern using the resist pattern coating liquid as an object.

The method for forming a resist pattern of the present invention comprises the steps of: forming a resist pattern on a substrate on which an underlayer film is formed; applying the coating liquid for resist pattern coating of the present invention so that the resist pattern is coated with the coating liquid for resist pattern coating; heating the substrate onto which the coating liquid for resist pattern coating is applied at 50° C. to 130° C. to form a coated film on the surface of the resist pattern; cooling the heated substrate and thereafter developing the coated film with a developing liquid; and rinsing the resist pattern with a rinsing liquid after developing the coated film with the developing liquid. According to this method, the resist pattern that has finer (reduced-size) resist pattern than the resist pattern initially formed on a substrate can be formed.

Examples of the substrate include a substrate used for producing a precision integrated circuit element (for example, a semiconductor substrate such as a silicon substrate coated with a silicon oxide film, a silicon nitride film, or a silicon oxynitride film, a silicon nitride substrate, a quartz substrate, an alkali-free glass substrate, a low alkali glass substrate, a crystallized glass substrate, and a glass substrate on which an ITO film is formed). An organic film and/or an inorganic film having antireflective properties are/is formed on the substrate as an underlayer film.

Examples of the shape of the resist pattern include a line-like shape and a pillar-like (column-like) shape, and any of an isolated line pattern, a line and space pattern, an isolated dot pattern, and a dense dot pattern may be formed. The shape of the line-like resist pattern is not limited to a straight line, and a bent shape may be used. The shape of the pillar-like resist pattern may be either a prismatic column or a cylindrical column as long as the shape is a column-like shape. The resist pattern having such a shape can be formed by a known lithography process using a known positive type resist solution (for example, PAR710 and PAR855, manufactured by Sumitomo Chemical Co., Ltd. and AR2772JN, manufactured by JSR Corporation). For example, an i-line, a KrF excimer laser, an ArF excimer laser, and EUV can be employed as the light source of an exposure apparatus to be used.

In the step of applying the coating liquid for resist pattern coating of the present invention, the coating liquid is applied onto the substrate on which the resist pattern is formed by a suitable coating method such as a spinner and a coater.

In the step of heating the substrate coated with the coating liquid for resist pattern coating to form a coated film on a surface of the resist pattern, the step of heating the substrate is carried out for diffusing the sulfonic acid included in the coating liquid for resist pattern coating of the present invention to the surface of the resist pattern. Therefore, the heating temperature may be any temperature required to diffuse the sulfonic acid, but the temperature should be a temperature at which the shape of the resist pattern does not significantly deform (for example, melt flow). Therefore, the heating temperature is more preferably a temperature lower than 130° C., for example, a temperature not exceeding 100° C. By heating at the heating temperature, however, the coating liquid for resist pattern coating of the present invention is not cured.

Examples of the developing liquid used in the step of developing the coated film after the step of heating and forming a coated film include aqueous solutions of alkalis including inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine. The aqueous solution of the alkalis to which an appropriate amount of alcohols such as isopropyl alcohol, a nonionic surfactant, and the like is added can also be used. Among them, the preferable developing liquid is the aqueous solution of the quaternary ammonium salt, more preferably the aqueous solution of tetramethylammonium hydroxide.

Examples of the rinsing liquid used in the step of rinsing after the step of developing include pure water and an aqueous solution of a surfactant.

[Method of Forming Reverse Pattern]

The present invention also includes a method of forming a reverse pattern using the resist pattern coating liquid as an object.

In the method for forming a reverse pattern of the present invention, the steps from forming a resist pattern; applying the coating liquid for resist pattern coating; heating the substrate onto which the coating liquid is applied to form a coated film on a surface of the resist pattern; to developing the coated film with a developing liquid after heating; or further to rinsing the resist pattern with a rinsing liquid are carried out according to each of the steps in [Method for forming resist pattern]. Thereafter, the method comprises the steps of: applying a second coating liquid including polysiloxane and a solvent including water and/or alcohols so that a space between patterns of the resist pattern is filled with the second coating liquid; removing or reducing components except polysiloxane included in the second coating liquid and the developing liquid or the rinsing liquid to form a coated film; carrying out etch-back of the coated film to expose the upper surface of the resist pattern after developing with the developing liquid or after rinsing with the rinsing liquid; and removing the resist pattern the upper surface of which is exposed. Then, the reverse pattern is formed.

The polysiloxane included in the second coating liquid is not particularly limited. Examples of the polysiloxane include a product obtained by mixing the cohydrolysis condensate of the compound of Formula (11) and the compound of Formula (12) with the compound of Formula (13).

(11)

(12)

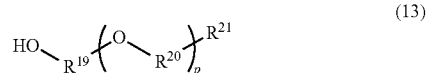
(13)

(where $R^{18}$ is a $C_{1-12}$ organic group; Y and Z are each independently methyl group or ethyl group, $R^{19}$ and $R^{20}$ are each independently a linear or branched alkylene group having a carbon atom number of 1 to 3; $R^{21}$ is a $C_{1-4}$ alkoxy group, an allyloxy group, or hydroxy group; and p is 0, 1 or 2.)

The alcohols included in the second coating liquid are, for example, the compounds of Formula (13). Examples of the compounds of Formula (13) include propylene glycol monomethyl ether, propylene glycol monoethyl ether, propylene glycol monopropyl ether, propylene glycol monobutyl ether, ethylene glycol monomethyl ether, ethylene glycol monoethyl ether, ethylene glycol monopropyl ether, ethylene glycol monobutyl ether, ethylene glycol monoallyl ether, dipropylene glycol monomethyl ether, diethylene glycol monomethyl ether, diethylene glycol monobutyl ether, triethylene glycol monomethyl ether, triethylene glycol monoethyl ether, triethylene glycol monopropyl ether, triethylene glycol monobutyl ether, ethylene glycol, 1,2-propane diol or 1,3-propane diol, diethylene glycol, dipropylene glycol, diisopropylene glycol, and triethylene glycol.

In the step of forming the coated film, removing or reducing components except polysiloxane included in the second coating liquid and the developing liquid (or the rinsing liquid) is carried out, for example, by spin drying the substrate with the underlayer film to which the second coating liquid is applied or heating the spin-dried substrate after the spin drying. Here, the spin dry means to dry the substrate while rotating the substrate. The components except the polysiloxane included in the second coating liquid are solvents including water and/or alcohols and additives added if necessary.

The etching back to the coated film carried out in the step of exposing the upper surface of the resist pattern can be carried out by dry etching using a fluorine-based gas such as $CF_4$, wet etching using an organic acid solution or an organic base solution, wet etching using an organic solvent, or a CMP method. Processing conditions can be appropriately adjusted.

The step of removing the resist pattern the upper surface of which is exposed is carried out, for example, by dry etching using a mixed gas of $O_2$ and $N_2$ or $O_2$ gas, or by ashing. When the removal is carries out by ashing, the ashing is required to be carried out under conditions in which only the resist pattern is selectively removed.

EXAMPLES

The weight average molecular weight (Mw) of the polymers obtained in the following Synthesis Examples 1 to 4, the cohydrolysis condensate obtained in the following Synthesis Example 5, and the polymers obtained in the following Synthesis Examples 6 to 8 are measurement results obtained by gel permeation chromatography (hereinafter abbreviated as GPC). For the measurement, a GPC apparatus manufactured by Tosoh Corporation was used. Measurement conditions were as follows.

Measurement apparatus: HLC-8020GPC [trade name] (manufactured by TOSOH CORPORATION)
GPC columns: TSKgel [registered trademark] G2000HXL; 2 columns, TSKgel G3000HXL; 1 column, and TSKgel G4000HXL; 1 column (all of the columns are manufactured by TOSOH CORPORATION)
Column temperature: 40° C.
Solvent: Tetrahydrofuran (THF)
Flow rate: 1.0 mL/min
Standard sample: Polystyrene (manufactured by TOSOH CORPORATION)

Synthesis Example 1

In 43.0 g of ethyl lactate, 11.0 g of tert-butylstyrene (manufactured by Tokyo Chemical Industry Co., Ltd.), 4.0 g of methacrylic acid (manufactured by Tokyo Chemical Industry Co., Ltd.), and 1.71 g of azobisisobutyronitrile (manufactured by Tokyo Chemical Industry Co., Ltd.) were dissolved. The solution was slowly added dropwise to 100.4 g of ethyl lactate refluxed by heating. After the dropwise addition, the resultant solution was refluxed by heating at 160° C. and react for 24 hours to give a solution containing a polymer. The reaction solution was precipitated in 2,000 g of a water/methanol mixed solvent. The obtained white solid was filtered and thereafter dried under reduced pressure overnight at 60° C. to give a white polymer. GPC analysis of this polymer showed a weight average molecular weight of 1,965 in terms of standard polystyrene. The obtained polymer is presumed to be a copolymer having the structure unit of the following formula.

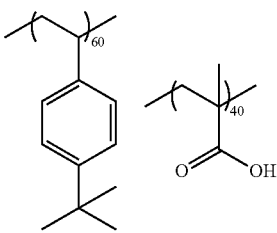

Synthesis Example 2

In 43.1 g of ethyl lactate, 9.5 g of tert-butylstyrene (manufactured by Tokyo Chemical Industry Co., Ltd.), 4.1 g of methacrylic acid (manufactured by Tokyo Chemical Industry Co., Ltd.), 1.3 g of N-isopropylacrylamide (manufactured by Tokyo Chemical Industry Co., Ltd.), and 0.98 g of azobisisobutyronitrile (manufactured by Tokyo Chemical Industry Co., Ltd.) were dissolved. The solution was slowly added dropwise to 100.7 g of ethyl lactate refluxed by heating. After the dropwise addition, the resultant solution was refluxed by heating at 160° C. to react for 24 hours to give a solution containing a polymer. The reaction solution was precipitated in 2,000 g of a water/methanol mixed solvent. The obtained white solid was filtered and thereafter dried under reduced pressure overnight at 60° C. to give a white polymer. GPC analysis of this polymer showed a weight average molecular weight of 1,809 in terms of standard polystyrene. The obtained polymer is presumed to be a copolymer having the structure unit of the following formula.

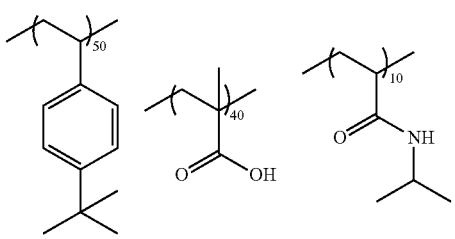

Synthesis Example 3

In 43.0 g of ethyl lactate, 9.1 g of tert-butylstyrene (manufactured by Tokyo Chemical Industry Co., Ltd.), 3.9 g of methacrylic acid (manufactured by Tokyo Chemical Industry Co., Ltd.), 1.9 g of 2,2,2-trifluoroethyl methacrylate (manufactured by Tokyo Chemical Industry Co., Ltd.), and 1.71 g of azobisisobutyronitrile (manufactured by Tokyo Chemical Industry Co., Ltd.) were dissolved. The solution was slowly added dropwise to 100.4 g of ethyl lactate refluxed by heating. After the dropwise addition, the resultant solution was refluxed by heating at 160° C. to react for 24 hours to give a solution containing a polymer. The reaction solution was precipitated in 2,000 g of a water/methanol mixed solvent. The obtained white solid was filtered and thereafter dried under reduced pressure overnight at 60° C. to give a white polymer. GPC analysis of this polymer showed a weight average molecular weight of 1,550 in terms of standard polystyrene. The obtained polymer is presumed to be a copolymer having the structure unit of the following formula.

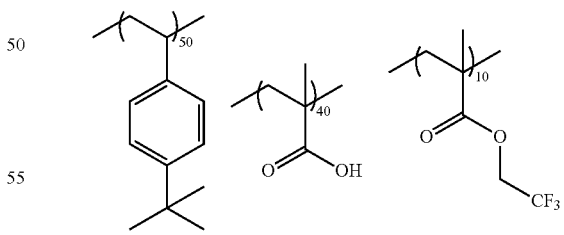

Synthesis Example 4

In 43.1 g of ethyl lactate, 8.7 g of tert-butylstyrene (manufactured by Tokyo Chemical Industry Co., Ltd.), 3.7 g of methacrylic acid (manufactured by Tokyo Chemical Industry Co., Ltd.), 2.6 g of 1,1,1,3,3,3-hexafluoroisopropyl methacrylate (manufactured by Tokyo Chemical Industry Co., Ltd.), and 0.98 g of azobisisobutyronitrile (manufactured by Tokyo Chemical Industry Co., Ltd.) were dissolved. The solution was slowly added dropwise to 100.11 g of ethyl lactate refluxed by heating. After the dropwise addition, the resultant solution was refluxed by heating at 160° C. to react for 24 hours to give a solution containing a polymer. The reaction solution was precipitated in 2,000 g of a water/methanol mixed solvent. The obtained white solid was filtered and thereafter dried under reduced pressure overnight at 60° C. to give a white polymer. GPC analysis of this polymer showed a weight average molecular weight of 1,847 in terms of standard polystyrene. The obtained polymer is presumed to be a copolymer having the structure unit of the following formula.

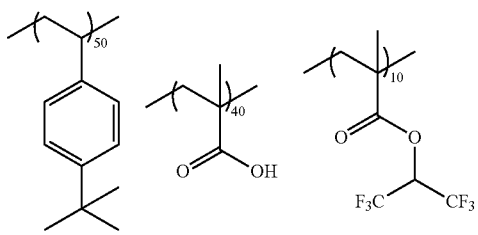

Synthesis Example 5

In a 200 mL flask, 5.8 g (30 mol %) of tetraethoxysilane, 6.7 g (40 mol %) of methyltriethoxysilane, 9.2 g of 5-(triethoxysilyl)norbornane-2,3-dicarboxylic anhydride (30 mol %) of the following formula, 43 g of acetone, and 43 g of ultrapure water were placed. To the mixed solution, 1.7 g of 0.01 mol/L hydrochloric acid was added dropwise, while stirring the mixed solution in the flask with a magnetic stirrer. After the dropwise addition, the flask was transferred to an oil bath adjusted to 40° C. and the resultant mixture was reacted under reflux by warming for 240 minutes. Thereafter, the reaction solution was cooled to room temperature. To the reaction solution, 24.0 g of propylene glycol monomethyl ether was added and acetone, water, and hydrochloric acid, and ethanol as a reaction by-product were distilled off from the reaction solution under reduced pressure to concentrate the solution to give a propylene glycol monomethyl ether solution of a cohydrolysis condensate (polysiloxane). The solid content concentration was adjusted so as to be 15% by mass in terms of solid residue at 140° C. The weight average molecular weight by GPC was 1,000 in terms of standard polystyrene.

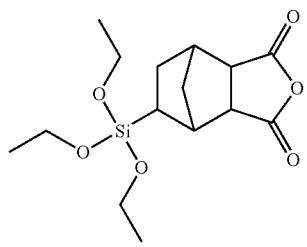 [SMILES: CCO[Si](OCC)(OCC)C1CC2CC1C1C(=O)OC(=O)C21]

Synthesis Example 6

To 45.00 g of tris(4-hydroxyphenyl)ethane (manufactured by Tokyo Chemical Industry Co., Ltd.), 53.35 g of 3,5-bis (trifluoromethyl)benzaldehyde (manufactured by Tokyo Chemical Industry Co., Ltd.), and 2.12 g of methanesulfonic acid (manufactured by Tokyo Chemical Industry Co., Ltd.), 150.70 g of propylene glycol monomethyl ether was added and the mixture was refluxed and stirred in a nitrogen atmosphere for 6 hours. After completion of the reaction, the reaction liquid was added dropwise into water to reprecipitate. The obtained precipitate was filtered, washed, and dried under reduced pressure at 60° C. to give 66.06 g of a polymer. The weight average molecular weight of this polymer measured by GPC in terms of standard polystyrene was 2,100. The obtained polymer is presumed to be a novolac resin having a structure unit of the following formula.

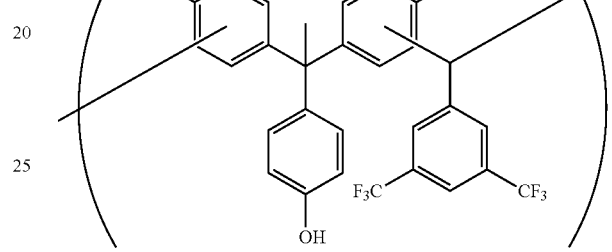

Synthesis Example 7

To 50.00 g of phloroglucinol (manufactured by Tokyo Chemical Industry Co., Ltd.), 16.43 g of 3,4-dihydroxybenzaldehyde (manufactured by Tokyo Chemical Industry Co., Ltd.), 67.20 g of 3,5-bis(trifluoromethyl)benzaldehyde (manufactured by Tokyo Chemical Industry Co., Ltd.), and 3.81 g of methanesulfonic acid (manufactured by Tokyo Chemical Industry Co., Ltd.), 206.15 g of propylene glycol monomethyl ether was added and the mixture was refluxed and stirred in a nitrogen atmosphere for 4 hours. After completion of the reaction, the reaction liquid was added dropwise into water to reprecipitate. The obtained precipitate was filtered, washed, and dried under reduced pressure at 60° C. to give 102.83 g of a polymer. The weight average molecular weight of this polymer measured by GPC in terms of standard polystyrene was 2,400. The obtained polymer is presumed to be a novolac resin having two structure units of the following formula.

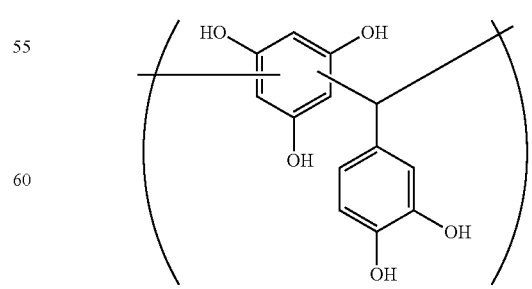

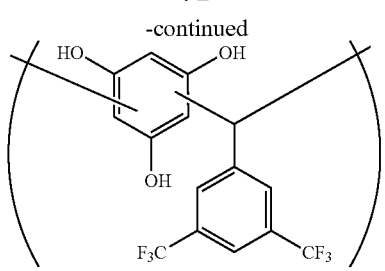

Synthesis Example 8

To 40.00 g of tris (4-hydroxyphenyl)ethane (manufactured by Tokyo Chemical Industry Co., Ltd.), 3.61 g of 3,4-dihydroxybenzaldehyde (manufactured by Tokyo Chemical Industry Co., Ltd.), 56.90 g of 3,5-bis(trifluoromethyl)benzaldehyde (manufactured by Tokyo Chemical Industry Co., Ltd.), and 2.51 g of methanesulfonic acid (manufactured by Tokyo Chemical Industry Co., Ltd.), 154.53 g of propylene glycol monomethyl ether was added and the mixture was refluxed and stirred in a nitrogen atmosphere for 6 hours. After completion of the reaction, the reaction liquid was added dropwise into water to reprecipitate. The obtained precipitate was filtered, washed, and dried under reduced pressure at 60° C. to give 63.01 g of a polymer. The weight average molecular weight of this polymer measured by GPC in terms of standard polystyrene was 2,600. The obtained polymer is presumed to be a novolac resin having two structure units of the following formula.

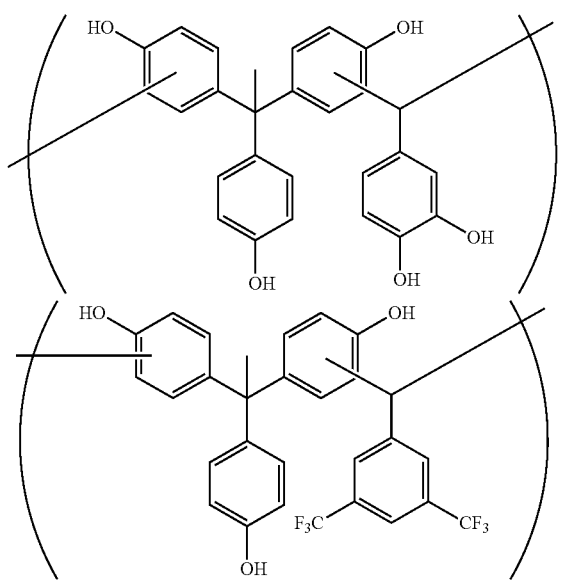

Example 1

To 1.33 g of the polymer obtained in Synthesis Example 1, 0.67 g of dodecylbenzenesulfonic acid (manufactured by JUNSEI CHEMICAL CO., LTD.) and 18.0 g of isoamyl ether were added and the mixture was dissolved. Thereafter, the resultant mixture was filtered using a polyethylene microfilter having a pore diameter of 0.05 µm to prepare a coating liquid for resist pattern coating.

Example 2

To 1.33 g of the polymer obtained in Synthesis Example 2, 0.67 g of dodecylbenzenesulfonic acid (manufactured by JUNSEI CHEMICAL CO., LTD.) and 18.0 g of isoamyl ether were added and the mixture was dissolved. Thereafter, the resultant mixture was filtered using a polyethylene microfilter having a pore diameter of 0.05 µm to prepare a coating liquid for resist pattern coating.

Example 3

To 1.33 g of the polymer obtained in Synthesis Example 3, 0.67 g of dodecylbenzenesulfonic acid (manufactured by JUNSEI CHEMICAL CO., LTD.) and 18.0 g of isoamyl ether were added and the mixture was dissolved. Thereafter, the resultant mixture was filtered using a polyethylene microfilter having a pore diameter of 0.05 µm to prepare a coating liquid for resist pattern coating.

Example 4

To 1.00 g of the polymer obtained in Synthesis Example 4, 0.50 g of dodecylbenzenesulfonic acid (manufactured by JUNSEI CHEMICAL CO., LTD.) and 13.50 g of isoamyl ether were added and the mixture was dissolved. Thereafter, the resultant mixture was filtered using a polyethylene microfilter having a pore diameter of 0.05 µm to prepare a coating liquid for resist pattern coating.

Comparative Example 1

To 1.5 g of the polymer obtained in Synthesis Example 4, 13.5 g of isoamyl ether were added and the mixture was dissolved. Thereafter, the resultant mixture was filtered using a polyethylene microfilter having a pore diameter of 0.05 µm to prepare a coating liquid for resist pattern coating.

Example 8

To 1.0 g of the polymer obtained in Synthesis Example 6, 0.50 g of dodecylbenzenesulfonic acid (manufactured by JUNSEI CHEMICAL CO., LTD.) and 13.5 g of isoamyl ether were added and the mixture was dissolved. Thereafter, the resultant mixture was filtered using a polyethylene microfilter having a pore diameter of 0.05 µm to prepare a coating liquid for resist pattern coating.

Example 9

To 1.0 g of the polymer obtained in Synthesis Example 7, 0.50 g of dodecylbenzenesulfonic acid (manufactured by JUNSEI CHEMICAL CO., LTD.) and 13.5 g of isoamyl ether were added and the mixture was dissolved. Thereafter, the resultant mixture was filtered using a polyethylene microfilter having a pore diameter of 0.05 µm to prepare a coating liquid for resist pattern coating.

Example 10

To 1.0 g of the polymer obtained in Synthesis Example 8, 0.50 g of dodecylbenzenesulfonic acid (manufactured by JUNSEI CHEMICAL CO., LTD.) and 13.5 g of isoamyl ether were added and the mixture was dissolved. Thereafter, the resultant mixture was filtered using a polyethylene microfilter having a pore diameter of 0.05 μm to prepare a coating liquid for resist pattern coating.

Comparative Example 2

To 1.5 g of the polymer obtained in Synthesis Example 8, 13.5 g of isoamyl ether were added and the mixture was dissolved. Thereafter, the resultant mixture was filtered using a polyethylene microfilter having a pore diameter of 0.05 μm to prepare a coating liquid for resist pattern coating.

[Application Test for Positive Type Resist Process]

The coating liquids for resist pattern coating prepared in Examples 1 to 4, Examples 8 to 10, and Comparative Example 1 and Comparative Example 2 of the present invention were applied onto a silicon wafer using a spinner and heated on a hot plate at 75° C. for 1 minute. The thicknesses of the obtained coated films were measured (Film thickness A: thickness of coated film). A commercially available alkaline developing liquid (product name: NMD-3, manufactured by TOKYO OHKA KOGYO CO., LTD) was filled on the coated film and left to stand for 60 seconds, followed by rinsing with pure water for 30 seconds while rotating at 3,000 rpm. After rinsing, the film was baked at 100° C. for 60 seconds to measure the film thickness (Film thickness B). The results are listed in Table 1 (Table 1-1 and Table 1-2). When the thickness B is 0 nm, it can be said that the coated film is removed by the developing liquid. This indicates that the coating liquid for resist pattern coating of the present invention can be applied to a positive type resist process.

TABLE 1-1

|  | Film Thickness A (nm) | Film Thickness B (nm) |
|---|---|---|
| Example 1 | 120.3 | 0 |
| Example 2 | 119.8 | 0 |
| Example 3 | 123.5 | 0 |
| Example 4 | 126.4 | 0 |
| Comparative Example 1 | 123.8 | 0 |

TABLE 1-2

|  | Film Thickness A (nm) | Film Thickness B (nm) |
|---|---|---|
| Example 8 | 120.8 | 0 |
| Example 9 | 121.2 | 0 |
| Example 10 | 120.9 | 0 |
| Comparative Example 2 | 119.8 | 0 |

[Formation of Photoresist Pattern]

ARC29A (manufactured by Nissan Chemical Industries, Ltd.) was applied onto a silicon wafer by a spinner. The silicon wafer was placed on a hot plate and heated at 205° C. for 1 minute to form a resist underlayer film having a thickness of 80 nm. A commercially available photoresist solution (product name: PAR855, manufactured by Sumitomo Chemical Co., Ltd.) was applied onto the resist underlayer film by a spinner and heated at 105° C. for 60 seconds on a hot plate to form a photoresist film (thickness 0.10 μm).

Subsequently, exposure to light was carried out through a photomask using a scanner (NSR-S307E (wavelength 193 nm, NA: 0.85, σ: 0.65/0.93), manufactured by Nikon Corporation)). The photomask is selected in accordance with the resist pattern to be formed. After the exposure, post exposure bake (PEB) was carried out on the hot plate at 105° C. for 60 seconds. After cooling, development was carried out by an industrial standard 60-second single paddle type step using 0.26 N tetramethylammonium hydroxide aqueous solution as the developing liquid. Through the above steps, a target resist pattern was formed. The width of the line pattern with regard to the formed line and space pattern was measured.

[Process for Reducing Size of Resist Pattern]

Each of the coating liquids for resist pattern coating prepared in Examples 1 to 4, Examples 8 to 10, and Comparative Example 1 and Comparative Example 2 of the present invention was applied onto the resist pattern (line and space patterns of 1:1) formed on a silicon wafer using a spinner. The applied liquid was baked at 75° C., and thereafter developed using a 0.26 N tetramethylammonium hydroxide aqueous solution as a developing liquid. The width of the line pattern with regard to the formed line and space pattern after development was measured. The results are listed in Table 2 (Table 2-1 and Table 2-2).

TABLE 2-1

|  | Width of line pattern/nm | | |
|---|---|---|---|
|  | Before development | After development | Difference/nm |
| Example 1 | 65 | 51 | 14 |
| Example 2 | 65 | 56 | 9 |
| Example 3 | 65 | 51 | 14 |
| Example 4 | 64 | 51 | 13 |
| Comparative Example 1 | 65 | 64 | 1 |

TABLE 2-2

|  | Width of line pattern/nm | | |
|---|---|---|---|
|  | Before development | After development | Difference/nm |
| Example 8 | 65 | 57 | 13 |
| Example 9 | 65 | 57 | 13 |
| Example 10 | 66 | 49 | 17 |
| Comparative Example 2 | 65 | 63 | 2 |

Subsequently, each of the coating liquids for resist pattern coating prepared in Example 4 or Example 10 of the present invention was applied onto the four types of resist patterns (isolated line pattern and line and space patterns of 1:3, 1:2, and 1:1.25) formed on silicon wafers using a spinner. The applied liquid was baked at 75° C., and thereafter developed with a 0.26 N tetramethylammonium hydroxide aqueous solution as a developing liquid. The widths of the line patterns with regard to the isolated line pattern and line and space patterns after development were measured. The results are listed in Table 3.

TABLE 3-1

(Coating liquid for resist pattern coating in Example 4)

| Resist Pattern | Isolated line pattern | 1:3 Line & space | 1:2 Line & space | 1:1.25 Line & space |
|---|---|---|---|---|
| Before development/nm | 79 | 82 | 79 | 84 |
| After development/nm | 54 | 56 | 52 | 57 |
| Difference/nm | 25 | 26 | 27 | 27 |

TABLE 3-2

(Coating liquid for resist pattern coating in Example 10)

| Resist Pattern | Isolated line pattern | 1:3 Line & space | 1:2 Line & space | 1:1.25 Line & space |
|---|---|---|---|---|
| Before development/nm | 77 | 75 | 78 | 78 |
| After development/nm | 64 | 63 | 64 | 64 |
| Difference/nm | 13 | 12 | 14 | 14 |

Example 5

[Process for Reducing Size of Resist Pattern]

The coating liquid for resist pattern coating prepared in Example 1 of the present invention was applied onto the resist pattern (line and space patterns of 1:1) formed on a silicon wafer using a spinner. The applied liquid was baked at 85° C., and thereafter developed with a 0.26 N tetramethylammonium hydroxide aqueous solution as the developing liquid to give a resist pattern having a reduced width of the line pattern (hereinafter referred to as a reduced size resist pattern in the present specification). The shape of the obtained reduced size resist pattern was observed with a cross-sectional SEM.

Example 6

[Embedding Process of Reduced Size Resist Pattern]

The coating liquid for resist pattern coating prepared in Example 1 of the present invention was applied onto the resist pattern (line and space patterns of 1:1) formed on a silicon wafer using a spinner. The applied liquid was baked at 85° C., and thereafter developed with a 0.26 N tetramethylammonium hydroxide aqueous solution as the developing liquid to a reduced size resist pattern. Subsequently, a second coating liquid prepared by adding ultrapure water and propylene glycol monomethyl ether in a ratio of 7:3 (mass ratio) to the polysiloxane solution obtained in Synthesis Example 5 was applied onto this silicon wafer to replace the 0.26 N tetramethylammonium aqueous solution to this second coating liquid. Thereafter, the reduced size resist pattern was embedded by spinning the silicon wafer at 1,500 rpm for 60 seconds to dry the solvent in the coating liquid and thereafter heating the silicon wafer at 100° C. for 60 seconds to form a coated film. The state after the embedding was observed with a cross-sectional SEM. The result is illustrated in FIG. 1.

Example 7

[Formation Process of Reverse Pattern]

Figure 2:
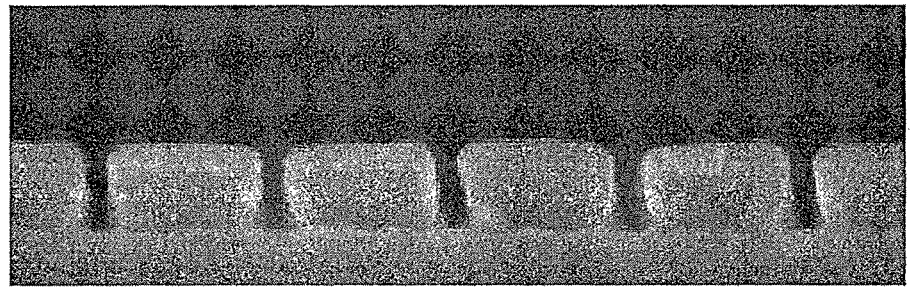
FIG. 2 is a cross-sectional SEM image illustrating a pattern shape when a reverse pattern is formed by dry etching after embedding a reduced size resist pattern with a second coating liquid in Example 7.

The coated film formed using the second coating liquid was etched back by dry etching using a mixed gas of $CF_4$ (flow rate: 50 sccm) and Ar (flow rate: 200 sccm) to expose the upper portion of the resist pattern. Thereafter, the resist pattern was removed by dry etching using a mixed gas of $O_2$ (flow rate: 10 sccm) and $N_2$ (flow rate: 20 sccm) to give a reverse pattern. The shape of the reverse pattern was observed with a cross-sectional SEM. The result is illustrated in FIG. 2.

Evaluation results of the pattern embeddability and the pattern shape are summarized in Table 4. In Table 4, "Good" means that the resist pattern was embedded without generation of voids (cavities) with respect to the pattern embeddability and the pattern is formed without pattern collapse and scum generated with respect to the pattern shape.

TABLE 4

| | Presence or absence of coated film formation using second coating liquid | Pattern embeddability | Pattern shape |
|---|---|---|---|
| Example 5 | Absence | — | Good |
| Example 6 | Presence | Good | — |
| Example 7 | Presence | — | Good |

The invention claimed is:

1. A coating liquid for resist pattern coating comprising:
a component A: a polymer including at least one hydroxy group or carboxy group;
a component B: a sulfonic acid of A-$SO_3$H where A is a linear or branched alkyl group or fluorinated alkyl group having a carbon atom number of 1 to 16, an aromatic group having at least one of the alkyl group or the fluorinated alkyl group as a substituent, or a $C_{4\text{-}16}$ alicyclic group optionally having a substituent; and
a component C: an organic solvent capable of dissolving the polymer and including a compound of $R^1$—O—$R^2$ and/or $R^1$—C(=O)—$R^2$ where $R^1$ is a linear, branched, or cyclic alkyl group or fluorinated alkyl group having a carbon atom number of 3 to 16; and $R^2$ is a linear, branched, or cyclic alkyl group or fluorinated alkyl group having a carbon atom number of 1 to 16; wherein
the polymer being the component A is a polymer having a structure unit of Formula (A) below with the proviso that the polymer having the structure unit of Formula (A) below includes at least one hydroxy group or carboxy group, or at least one hydroxy group or carboxy group and a linear or branched alkyl group having a carbon atom number of 1 to 10 in which a halogen atom is optionally substituted for at least one hydrogen atom:

(A)

where
$R^0$ is a hydrogen atom or methyl group;
L is a divalent aromatic group optionally having at least one substituent, —C(=O)—O— group or —C(=O)—NH— group, and a carbon atom of the —C(=O)—O— group or the —C(=O)—NH— group is bonded to the main chain of the polymer;
X is a hydrogen atom or a linear or branched alkyl group having a carbon atom number of 1 to 10 or an alkoxy group having a carbon atom number of 1 to 10, and a halogen atom or hydroxy group is optionally substituted for at least one hydrogen atom of the alkyl group.

2. The coating liquid for resist pattern coating according to claim 1, wherein X in the structure unit of Formula (A) is a linear or branched alkyl group having a carbon atom number of 1 to 10 in which a halogen atom is optionally substituted for at least one hydrogen atom.

3. The coating liquid for resist pattern coating according to claim 1, wherein the polymer being the component A is a copolymer having at least two structure units of Formula (A), and the copolymer has:

a structural unit of a divalent aromatic group optionally having at least one substituent as L; and a structure unit of —C(=O)—O— group and/or a structure unit of —C(=O)—NH— group as L.

4. The coating liquid for resist pattern coating according to claim 1, wherein the divalent aromatic group in L is phenylene group or naphthylene group.

5. A coating liquid for resist pattern coating comprising:

1 ppm by mass to 1% by mass of water;

a component A: a polymer including at least one hydroxy group or carboxy group;

a component B: a sulfonic acid of A-SO$_3$H where A is a linear or branched alkyl group or fluorinated alkyl group having a carbon atom number of 1 to 16, an aromatic group having at least one of the alkyl group or the fluorinated alkyl group as a substituent, or a C$_{4-16}$ alicyclic group optionally having a substituent; and a component C: an organic solvent capable of dissolving the polymer and including a compound of R$^1$—O—R$^2$ and/or R$^1$—C(=O)—R$^2$ where R$^1$ is a linear, branched, or cyclic alkyl group or fluorinated alkyl group having a carbon atom number of 3 to 16; and R$^2$ is a linear, branched, or cyclic alkyl group or fluorinated alkyl group having a carbon atom number of 1 to 16: wherein the polymer being the component A is a polymer having a structure unit of any one of Formulas (1-1) to (1-4) below, or a polymer having a structure unit of any one of Formulas (1-1) to (1-4) below and optionally including a linear or branched alkyl group having a carbon atom number of 1 to 10 in which a halogen atom is optionally substituted for at least one hydrogen atom:

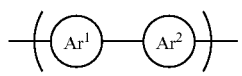
(1-1)

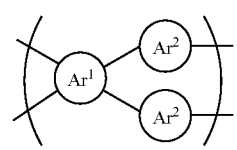
(1-2)

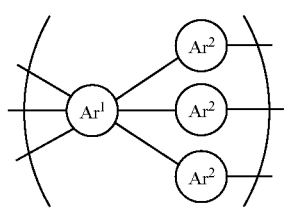
(1-3)

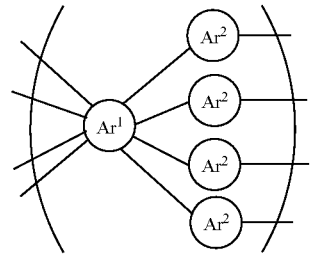
(1-4)

where Ar$^1$ is a divalent, tetravalent, hexavalent, or octavalent organic group including at least one C$_{6-18}$ aromatic ring; Ar$^2$ is a divalent organic group including a C$_{6-18}$ aromatic ring bonded to Ar$^1$ through methylene group or a tertiary carbon atom, and at least one of the aromatic rings have hydroxy group and/or carboxy group as a substituent.

6. The coating liquid for resist pattern coating according to claim 5, wherein the divalent, tetravalent, hexavalent, or octavalent organic group of Ar$^1$ is a group having bonded ends bonded to any two, four, six, or eight positions of aromatic rings in a compound of any one of Formulas (2-1) to (2-5) below, and Ar$^2$ is a divalent organic group of Formula (3-1) below, or a divalent organic group of Formula (3-2) below:

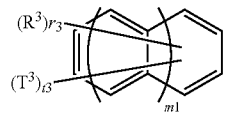
(2-1)

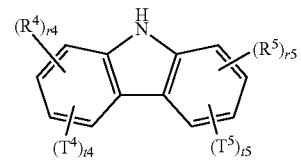
(2-2)

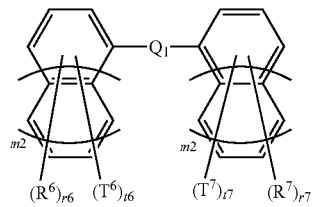
(2-3)

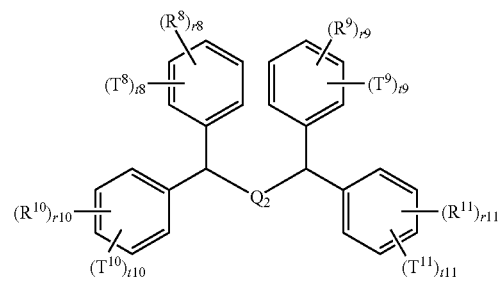
(2-4)

-continued

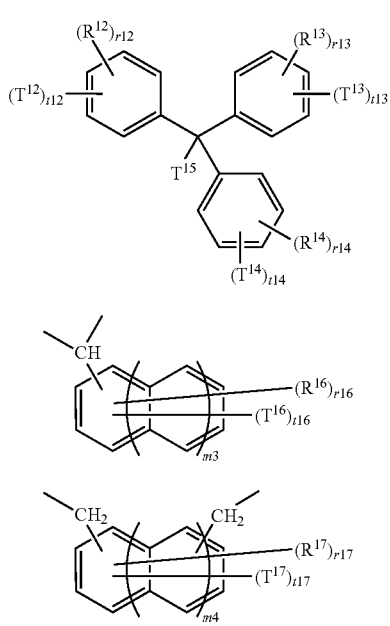

where
R³ to R¹⁴, R¹⁶, and R¹⁷ are each independently a linear, branched, or cyclic alkyl group having a carbon atom number of 1 to 10, a linear or branched alkoxy group having a carbon atom number of 1 to 9, a halogen atom, nitro group, cyano group, acetoxy group, methylthio group, or amino group; hydroxy group or a halogen atom is optionally substituted for at least one hydrogen atom of the alkyl group; a linear or branched alkyl group having a carbon atom number of 1 to 3 is optionally substituted for at least one hydrogen atom of the amino group;
T³ to T¹⁴, T¹⁶, and T¹⁷ are each independently hydroxy group or carboxy group;
T¹⁵ is a hydrogen atom or methyl group;
$Q_1$ and $Q_2$ are each independently a single bond, an oxygen atom, a sulfur atom, sulfonyl group, carbonyl group, imino group, a $C_{6-40}$ arylene group, or a linear, branched, or cyclic alkylene group having a carbon atom number of 1 to 10; a halogen atom is optionally substituted for at least one hydrogen atom of the alkylene group;
m1 to m4 are each independently an integer of 0 to 2;
r4, r5, and r8 to r14 are each independently an integer of 0 to 2;
t4, t5, and t8 to t14 are each independently an integer of 0 to 2;
r3, r6, r7, and r17 are each independently an integer of 0 to 8;
t3, t6, t7, and t17 are each independently an integer of 0 to 8;
r16 is an integer of 0 to 9;
t16 is an integer of 0 to 9; and
the sum of r3 and t3, the sum of r4 and t4, the sum of r5 and t5, the sum of r6 and t6, the sum of r7 and t7, the sum of r8 and t8, the sum of r9 and t9, the sum of r10 and t10, the sum of r11 and t11, the sum of r12 and t12, the sum of r13 and t13, the sum of r14 and t14, the sum of r16 and t16, and the sum of r17 and t17 are each independently an integer of 1 to 10.

7. The coating liquid for resist pattern coating according to claim 5, wherein the polymer being the component A has a weight average molecular weight of 1,000 to 20,000.

8. The coating liquid for resist pattern coating according to claim 1, wherein the polymer being the component A has a weight average molecular weight of 1,000 to 2,000.

9. The coating liquid for resist pattern coating according to claim 1, wherein the aromatic group of A in the formula of the sulfonic acid is phenyl group or naphthyl group.

10. The coating liquid for resist pattern coating according to claim 9, wherein
in the formula of the sulfonic acid, the group of A is a linear or branched alkyl group or fluorinated alkyl group having a carbon atom number of 4 to 12, or phenyl group having at least one of the alkyl group or the fluorinated alkyl group as a substituent, and
the sulfonic acid has a content ratio of 0.5% by mass to 60% by mass relative to the polymer being the component A.

11. The coating liquid for resist pattern coating according to claim 1, including 1 ppm by mass to 1% by mass of water.

12. A method for forming a resist pattern comprising the steps of:
forming a resist pattern on a substrate on which an underlayer film is formed;
applying a coating liquid for resist pattern coating so that the resist pattern is coated with the coating liquid for resist pattern coating, wherein
the coating liquid for resist pattern coating comprises:
a component A: a polymer including at least one hydroxy group or carboxy group,
a component B: a sulfonic acid of A-SO₃H where A is a linear or branched alkyl group or fluorinated alkyl group having a carbon atom number of 1 to 16, an aromatic group having at least one of the alkyl group or the fluorinated alkyl group as a substituent, or a $C_{4-16}$ alicyclic group optionally having a substituent, and
a component C: an organic solvent capable of dissolving the polymer and including a compound of R¹—O—R² and/or R¹—C(=O)—R² where
R¹ is a linear, branched, or cyclic alkyl group or fluorinated alkyl group having a carbon atom number of 3 to 16, and
R² is a linear, branched, or cyclic alkyl group or fluorinated alkyl group having a carbon atom number of 1 to 16;
heating the substrate onto which the coating liquid for resist pattern coating is applied at 50° C. to 130° C. to form a coated film on a surface of the resist pattern;
cooling the heated substrate and thereafter developing the coated film with a developing liquid; and
rinsing the resist pattern with a rinsing liquid after developing the coated film with the developing liquid.

13. A method for forming a reverse pattern comprising the steps of:
forming a resist pattern on a substrate on which an underlayer film is formed;
applying a coating liquid for resist pattern coating so that the resist pattern is coated with the coating liquid for resist pattern coating, wherein
the coating liquid for resist pattern coating comprises:
a component A: a polymer including at least one hydroxy group or carboxy group,
a component B: a sulfonic acid of A-SO₃H where A is a linear or branched alkyl group or fluorinated alkyl group having a carbon atom number of 1 to 16, an aromatic group having at least one of the alkyl group or the fluorinated alkyl group as a substituent, or a $C_{4-16}$ alicyclic group optionally having a substituent, and a component C: an organic solvent capable of dissolving the polymer and including a compound of $R^1\text{—O—}R^2$ and/or $R^1\text{—C(=O)—}R^2$ where $R^1$ is a linear, branched, or cyclic alkyl group or fluorinated alkyl group having a carbon atom number of 3 to 16, and $R^2$ is a linear, branched, or cyclic alkyl group or fluorinated alkyl group having a carbon atom number of 1 to 16;

heating the substrate onto which the coating liquid for resist pattern coating is applied at 50° C. to 130° C. to form a coated film on a surface of the resist pattern;

cooling the heated substrate and thereafter developing the coated film with a developing liquid;

applying a second coating liquid including polysiloxane and a solvent including water and/or alcohols so that a space between patterns of the resist pattern after developing the coated film with the developing liquid is filled with the second coating liquid;

removing or reducing components except polysiloxane included in the second coating liquid and the developing liquid to form a coated film;

carrying out etch-back of the coated film to expose an upper surface of the resist pattern after developing with the developing liquid; and removing the resist pattern the upper surface of which is exposed.

14. A method for forming a reverse pattern comprising the steps of:

forming a resist pattern on a substrate on which an underlayer film is formed;

applying a coating liquid for resist pattern coating so that the resist pattern is coated with the coating liquid for resist pattern coating, wherein the coating liquid for resist pattern coating comprises:

a component A: a polymer including at least one hydroxy group or carboxy group, a component B: a sulfonic acid of $A\text{-SO}_3H$ where A is a linear or branched alkyl group or fluorinated alkyl group having a carbon atom number of 1 to 16, an aromatic group having at least one of the alkyl group or the fluorinated alkyl group as a substituent, or a $C_{4-16}$ alicyclic group optionally having a substituent, and a component C: an organic solvent capable of dissolving the polymer and including a compound of $R^1\text{—O—}R^2$ and/or $R^1\text{—C(=O)—}R^2$ where $R^1$ is a linear, branched, or cyclic alkyl group or fluorinated alkyl group having a carbon atom number of 3 to 16, and $R^2$ is a linear, branched, or cyclic alkyl group or fluorinated alkyl group having a carbon atom number of 1 to 16;

heating the substrate onto which the coating liquid for resist pattern coating is applied at 50° C. to 130° C. to form a coated film on a surface of the resist pattern;

cooling the heated substrate and thereafter developing the coated film with a developing liquid;

rinsing the resist pattern with a rinsing liquid after developing the coated film with the developing liquid;

applying a second coating liquid including polysiloxane and a solvent including water and/or alcohols so that a space between patterns of the resist pattern after rinsing with the rinsing liquid is filled with the second coating liquid;

removing or reducing components except polysiloxane included in the second coating liquid and the rinsing liquid to form a coated film;

carrying out etch-back of the coated film to expose an upper surface of the resist pattern after rinsing with the rinsing liquid; and removing the resist pattern the upper surface of which is exposed.

* * * * *